(12) United States Patent
Kanai

(10) Patent No.: US 6,744,106 B2
(45) Date of Patent: Jun. 1, 2004

(54) NON-VOLATILE SEMICONDUCTOR MEMORY DEVICE

(75) Inventor: Masahiro Kanai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 54 days.

(21) Appl. No.: 10/197,668

(22) Filed: Jul. 18, 2002

(65) Prior Publication Data
US 2003/0020123 A1 Jan. 30, 2003

(30) Foreign Application Priority Data
Jul. 23, 2001 (JP) .......................................... 2001-221787

(51) Int. Cl.$^7$ .......................... H01L 29/76; H01L 29/94; H01L 31/062; H01L 31/113; H01L 31/119

(52) U.S. Cl. ........................ 257/390; 257/316; 257/320; 257/324

(58) Field of Search ................................ 257/316, 320, 257/324, 390

(56) References Cited

U.S. PATENT DOCUMENTS

| | | |
|---|---|---|
| 5,111,428 A | 5/1992 | Liang et al. |
| 5,126,808 A | 6/1992 | Montalvo et al. |
| 5,268,861 A | 12/1993 | Hotta |
| 5,315,541 A | 5/1994 | Harari et al. |
| 5,345,416 A | 9/1994 | Nakagawara |
| 5,408,115 A | 4/1995 | Chang |
| 5,422,504 A | 6/1995 | Chang et al. |
| 5,494,838 A | 2/1996 | Chang et al. |
| 5,969,383 A | 10/1999 | Chang et al. |
| 6,177,318 B1 | 1/2001 | Ogura et al. |
| 6,248,633 B1 | 6/2001 | Ogura et al. |
| 6,255,166 B1 | 7/2001 | Ogura et al. |
| 6,406,958 B2 * | 6/2002 | Kato et al. .................. 438/257 |

FOREIGN PATENT DOCUMENTS

| | | |
|---|---|---|
| JP | A 63-193400 | 8/1988 |
| JP | A 63-268194 | 11/1988 |
| JP | A 63-268195 | 11/1988 |
| JP | A 64-5072 | 1/1989 |
| JP | A 7-161851 | 6/1995 |
| JP | B1 2978477 | 9/1999 |
| JP | A 2001-156188 | 6/2001 |

OTHER PUBLICATIONS

U.S. patent application Ser. No. 10/153,686, Owa, filed May 24, 2002.
U.S. patent application Ser. No. 10/153,736, Owa, filed May 24, 2002.
U.S. patent application Ser. No. 10/157,896, Kamei et al., filed May 31, 2002.
U.S. patent application Ser. No. 10/157,897, Kamei et al., filed May 31, 2002.
U.S. patent application Ser. No. 10/115,956, Kamei, filed Apr. 5, 2002.
U.S. patent application Ser. No. 10/115,913, Kamei, filed Apr. 5, 2002.
U.S. patent application Ser. No. 10/153,611, Owa, filed May 24, 2002.

(List continued on next page.)

*Primary Examiner*—Ngân V. Ngô
(74) *Attorney, Agent, or Firm*—Oliff & Berridge, PLC

(57) ABSTRACT

A non-volatile semiconductor memory device has a memory cell array region in which a plurality of memory cells, each of the memory cells having first and second MONOS memory cells, are arranged. A control gate drive section has a plurality of control gate drivers. A plurality of switching elements are provided at connections between a plurality of main bit lines and a plurality of sub bit lines. Each of the sub bit lines has a projecting portion at one end. The projecting portion has a large-width region having a width greater than the width of each of the sub bit lines in a region in which the memory cells are formed.

12 Claims, 18 Drawing Sheets

OTHER PUBLICATIONS

U.S. patent application Ser. No. 09/955,160, Kanai et al., filed Sep. 19, 2001.

U.S. patent application Ser. No. 09/955,158, Kanai et al., filed Sep. 19, 2001.

Hayashi et al., "Twin MONOS Cell with Dual Control Gates", 2000 Symposium on VLSI Technology Digest of Technical Papers.

Chang et al., "A New SONOS Memory Using Source–Side Injection for Programming", IEEE Electron Device Letters, vol. 19, No. 7, 1998.

Chen et al., "A Novel Flash Memory Device with S Plit Gate Source Side Injection and ONO Charge Storage Stack (SPIN)", 1997 Symposium on VLSI Technology Digest Technical Papers.

* cited by examiner

FIG. 7A
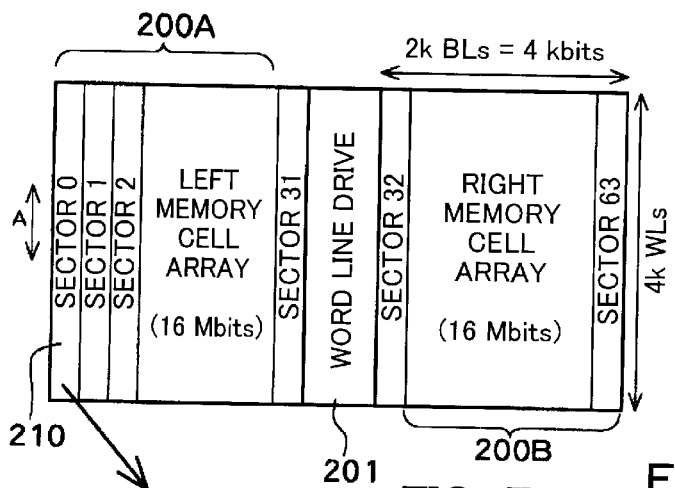
FIG. 7B
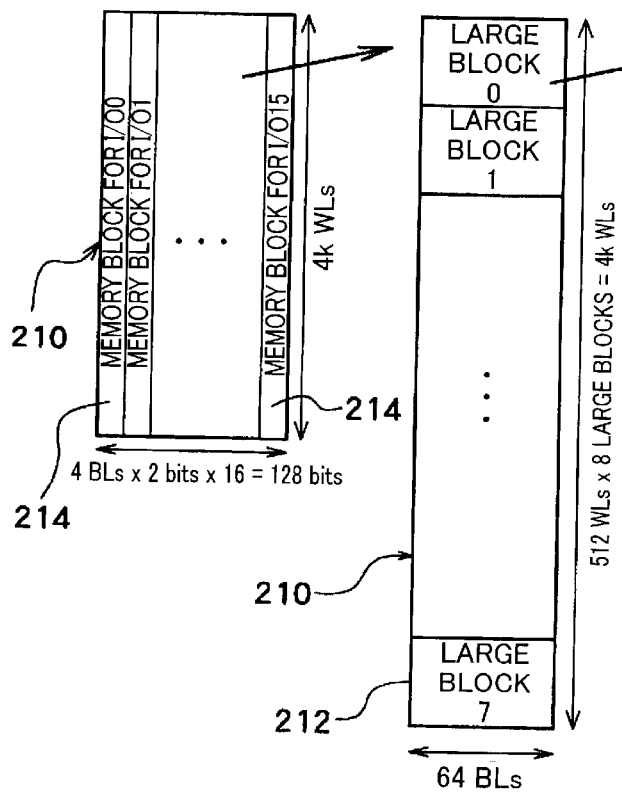
FIG. 7C
FIG. 7D
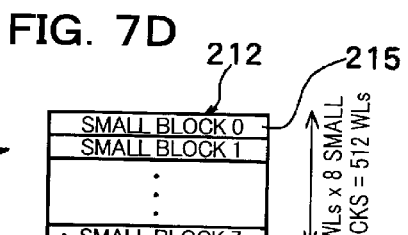
FIG. 7E
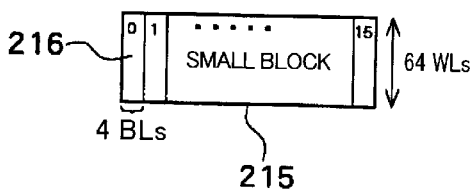

NON-VOLATILE SEMICONDUCTOR MEMORY DEVICE

Japanese Patent Application No. 2001-221787 filed on Jul. 23, 2001, is hereby incorporated by reference in its entirety.

BACKGROUND OF THE INVENTION

The present invention relates to a non-volatile semiconductor memory device including memory cells, each having two non-volatile memory elements controlled by one word gate and two control gates.

As one type of non-volatile semiconductor memory device, a MONOS (Metal-Oxide-Nitride-Oxide-Semiconductor or Substrate) device is known. In the MONOS non-volatile semiconductor memory device, a gate insulating layer between a channel and a gate is formed of a laminate consisting of a silicon oxide film, silicon nitride film, and silicon oxide film. Charges are trapped in the silicon nitride film.

The MONOS non-volatile semiconductor memory device is disclosed in the literature (Y. Hayashi, et al., 2000 Symposium on VLSI Technology Digest of Technical Papers, pp. 122–123). This literature discloses a MONOS flash memory cell including two non-volatile memory elements (MONOS memory cells) controlled by one word gate and two control gates. Specifically, one flash memory cell has two charge trap sites. A memory cell array region is formed by arranging a plurality of MONOS flash memory cells having such a structure in the row direction and the column direction.

In order to drive the MONOS flash memory cell, two bit lines, one word line, and two control gate lines are necessary. However, in the case of setting different control gates at the same potential when driving a large number of memory cells, these lines may be connected in common.

The operations of the flash memory consist of erasing, programming, and reading of data. Programming and reading of data are generally performed in 8-bits or 16-bits of selected cells at the same time. Erasing of data can be performed at the same time over a wider region.

A problem relating to this type of non-volatile memory is disturbance of data. The disturbance of data refers to the following phenomenon. When a high potential is applied to the control gate lines and the bit lines in the selected cells for programming or erasing, the high potential is also applied to the cells in a non-selected sector region through shared interconnects. As a result, the data in the non-selected cells is programmed or erased each time programming or erasing is performed, whereby the data in the non-selected cells is disturbed.

Such a phenomenon can be prevented by providing select gate circuits so that the high potential is applied only to the control gates in the cells in the selected sector, but is not applied to the control gates in the cells in the non-selected sector.

However, since this causes a voltage drop to occur in the select gate, a voltage for the voltage drop must be added in order to supply the high potential to the control gates in the cells in the selected sector at the time of programming or erasing. This hinders low voltage driving, whereby such a non-volatile memory cannot be applied to equipment for which a decrease in power consumption is needed, such as portable equipment.

BRIEF SUMMARY OF THE INVENTION

Accordingly, the present invention may provide a non-volatile semiconductor memory device enabling high-speed access when reading/writing while preventing the disturbance of data in the cells in the non-selected sector when programming or erasing in the selected cells.

The present invention may also provide a non-volatile semiconductor memory device capable of increasing the degree of integration of the memory cells while enabling high-speed access at the time of reading/writing.

Furthermore, the present invention may provide a non-volatile semiconductor memory device capable of reducing power consumption.

One aspect of the present invention provides a non-volatile semiconductor memory device comprising a memory cell array region in which are disposed a plurality of memory cells in first and second directions intersecting each other, each of the memory cells having first and second non-volatile memory elements that are controlled by one word gate and first and second control gates, and a control gate drive section which drives the first and second control gates of the memory cells within the memory cell array region.

The memory cell array region is divided in the second direction into a plurality of sector regions.

The control gate drive section has a plurality of control gate drivers each of which corresponds to one of the sector regions.

Each of the sector regions is divided in the first direction into a plurality of block regions, and each of the block regions has a plurality of memory cells. Each of the block regions has a plurality of sub bit lines respectively connected to the memory cells and extending in the first direction. A plurality of main bit lines are provided over the plurality of block regions extending in the first direction, and each of the main bit lines is commonly connected to the sub bit lines within the block regions. A plurality of switching elements which select connection/disconnection are provided at connections between the main bit lines and the sub bit lines. Therefore, a selected sub bit line and a main bit line connected thereto can be put in a conducting state, and a non-selected sub bit line and a main bit line connected thereto can be put in a non-conducting state, by the switching elements. As a result, since the interconnect capacitance of the bit lines can be decreased at the time of reading/writing, the memory cells can be accessed at a higher speed at the time of reading/writing.

The first control gate and the second control gate, which are connected with two memory cells adjacent in the second direction, are formed on either side of each of the sub bit lines. The first and second control gates formed on either side of each of the sub bit lines have two continuous portions in which end portions of the first and second control gates are connected. This enables the resistance of the control gates to be approximately halved in comparison with the case where the continuous portion is formed at end portions of the first and second control gates on only one side.

Each of the sub bit lines has a projecting portion in which one of the end portions project in the first direction outside end portion of an adjacent sub bit line among the sub bit lines arranged in the second direction. The projecting portion has a large-width region having a width greater than the width of each of the sub bit lines in a region in which the memory cells are formed. Therefore, contact portions for connecting the sub bit lines are easily formed at the projecting portions.

In this aspect of the present invention, each of the switching elements may be provided at a position facing the projecting portion of each of the sub bit lines. This enables the switching elements to be easily connected with the projecting portions of the sub bit lines.

In this aspect of the present invention, in each of the block regions, an odd-numbered switching element may be connected to an end portion of an odd-numbered sub bit line on one side, and an even-numbered switching element may be connected to an end portion of an even-numbered sub bit line on the opposite side, among the plurality of the sub bit lines. In this case, the degree of integration of the memory cells can be increased as described later.

In this aspect of the present invention, in two of the block regions adjacent to each other in the first direction, when the switching elements in one block region are referred to as first switching elements and the switching elements in the other block region are referred to as second switching elements, the first and second switching elements commonly connected to one of the main bit lines may be disposed to be adjacent to each other. This enables one impurity layer to be shared by the first and second switching elements, whereby the degree of integration of the memory cells can be increased. In the case where the switching elements are formed using field effect transistors (MOS transistors, for example), source/drain of the first switching element and source/drain of the second switching element can be electrically connected directly. This eliminates the need for a step of electrically connecting the source/drain of the first and second switching elements (for example, a step of forming a crossunder impurity layer).

In this aspect of the present invention, each of the control gate drivers may be capable of setting a potential for the first and second control gates within the corresponding sector region independently of other sector regions. Therefore, when programming the selected cells in one sector regions, only the control gate potential of the memory cells (selected cells and non-selected cells) in this sector region can be set to a program or erase potential by the corresponding control gate driver. Since the potential in other sector regions can be set to a potential other than the program or erase potential by the corresponding control gate drivers, data is not disturbed in the cells in the non-selected sector regions. This eliminates the need for select gate circuits for applying a potential only to the control gates in the specific cells in the selected block, whereby the degree of integration of the memory cells can be increased. Moreover, since a voltage drop does not occur in the select gate circuit, low voltage driving can be achieved. Therefore, the non-volatile semiconductor memory device can be effectively utilized particularly as a memory for portable equipment.

Another aspect of the present invention provides a non-volatile semiconductor memory device comprising a memory cell array region in which are disposed a plurality of memory cells in first and second directions intersecting each other, each of the memory cells having first and second non-volatile memory elements that are controlled by one word gate and first and second control gates, and a control gate drive section which drives the first and second control gates of the memory cells within the memory cell array region.

The memory cell array region is divided in the second direction into a plurality of sector regions;

The control gate drive section has a plurality of control gate drivers each of which corresponds to one of the sector regions.

Each of the sector regions is divided in the first direction into a plurality of block regions, and each of the block regions has a plurality of memory cells. Each of the block regions has a plurality of sub bit lines respectively connected to the memory cells and extending in the first direction. A plurality of main bit lines are provided over the plurality of block regions extending in the first direction, and each of the main bit lines is commonly connected to the sub bit lines within the block regions. A plurality of switching elements which select connection/disconnection are provided at connections between the main bit lines and the sub bit lines.

The sub bit lines are formed of sub bit impurity layers. Source/drain impurity layers which become one of a source and drain of the switching elements are formed by extending the sub bit impurity layers.

According to this aspect of the present invention, the source/drain impurity layers which become one of a source and drain of the switching elements are formed by extending the sub bit impurity layers. Specifically, the source/drain impurity layers are electrically connected directly with the sub bit lines. This eliminates the need for a step of electrically connecting the sub bit lines with the source/drain impurity layers (for example, a step of forming a crossunder impurity layer in the semiconductor substrate).

According to this aspect of the present invention, each of the switching elements may be formed at a position facing end portion of each of the sub bit lines, and the first control gate and the second control gate, which are connected with two memory cells adjacent in the second direction, may be formed on either side of each of the sub bit lines.

According to this aspect of the present invention, the first and second control gates formed on either side of the sub bit lines may have a non-continuous portion in which end portions on the side on which the switching elements are formed are not connected. The source/drain impurity layers are easily formed by extending the sub bit impurity layers by allowing the first and second control gates to have the non-continuous portion.

According to this aspect of the present invention, the first and second control gates formed on either side of the sub bit lines may have a continuous portion in which end portions opposite to the side on which the switching elements are formed are connected. This enables the first and second control gates formed on either side of the sub bit lines to be put in a conducting state.

In this aspect of the present invention, in each of the block regions, an odd-numbered switching element may be connected to an end portion of an odd-numbered sub bit line on one side, and an even-numbered switching element may be connected to an end portion of an even-numbered sub bit line on the opposite side, among the plurality of the sub bit lines. In this case, the degree of integration of the memory cells can be increased as described later.

In this aspect of the present invention, in two of the block regions adjacent to each other in the first direction, when the switching elements in one block region are referred to as first switching elements and the switching elements in the other block region are referred to as second switching elements, the first and second switching elements commonly connected to one of the main bit lines may be disposed to be adjacent to each other. This enables one impurity layer to be shared by the first and second switching elements, whereby the degree of integration of the memory cells can be increased.

In this aspect of the present invention, each of the control gate drivers may be capable of setting a potential for the first and second control gates within the corresponding sector region independently of other sector regions.

BRIEF DESCRIPTION OF THE SEVERAL
VIEWS OF THE DRAWING

Figure 1:
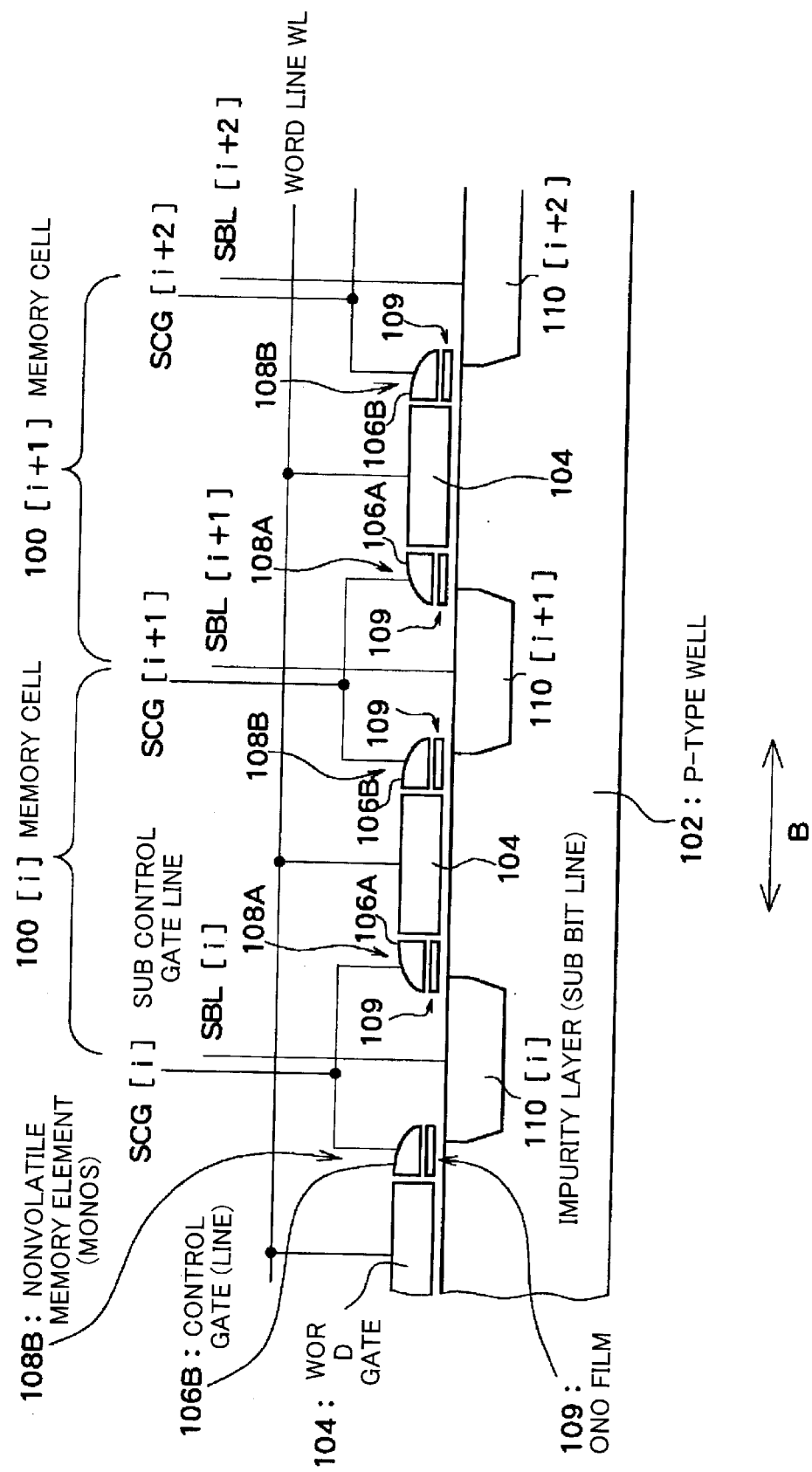
FIG. 1 is a cross-sectional view showing memory cells used in a non-volatile semiconductor memory device according to one embodiment of the present invention.

FIG. 7A is a view showing a planar layout of the entire non-volatile semiconductor memory device shown in FIG. 1; FIG. 7B is a plan view of one sector region shown in FIG. 7A; FIG. 7C is a plan view of the sector region; FIG. 7D is a plan view of one large block shown in FIG. 7C; and FIG. 7E is a plan view of one small block shown in FIG. 7D.

Figure 8:
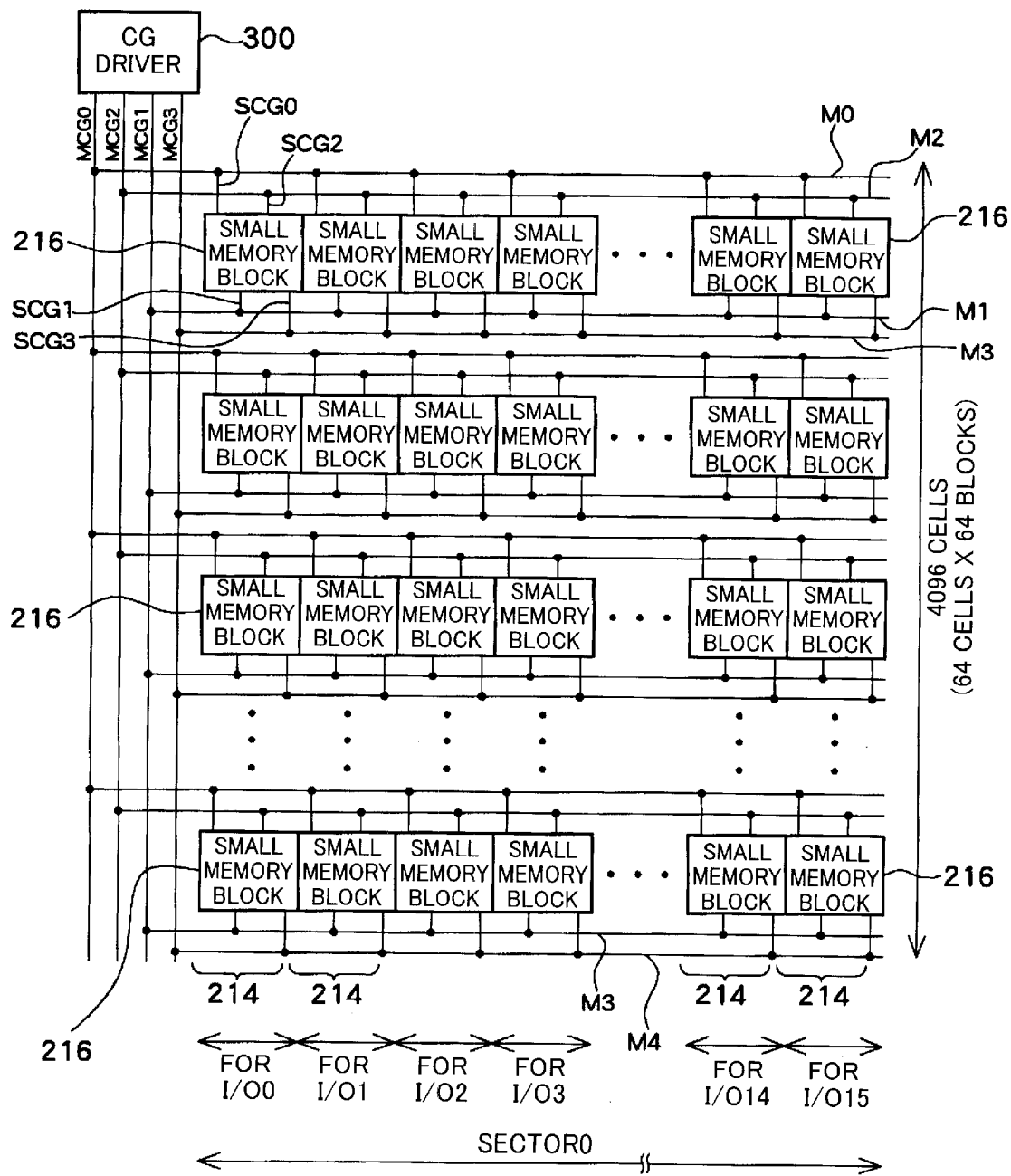

FIG. 8 is a schematic explanatory diagram for describing memory cells in one sector region shown in FIG. 7B and interconnects for the memory cells.

Figure 9:
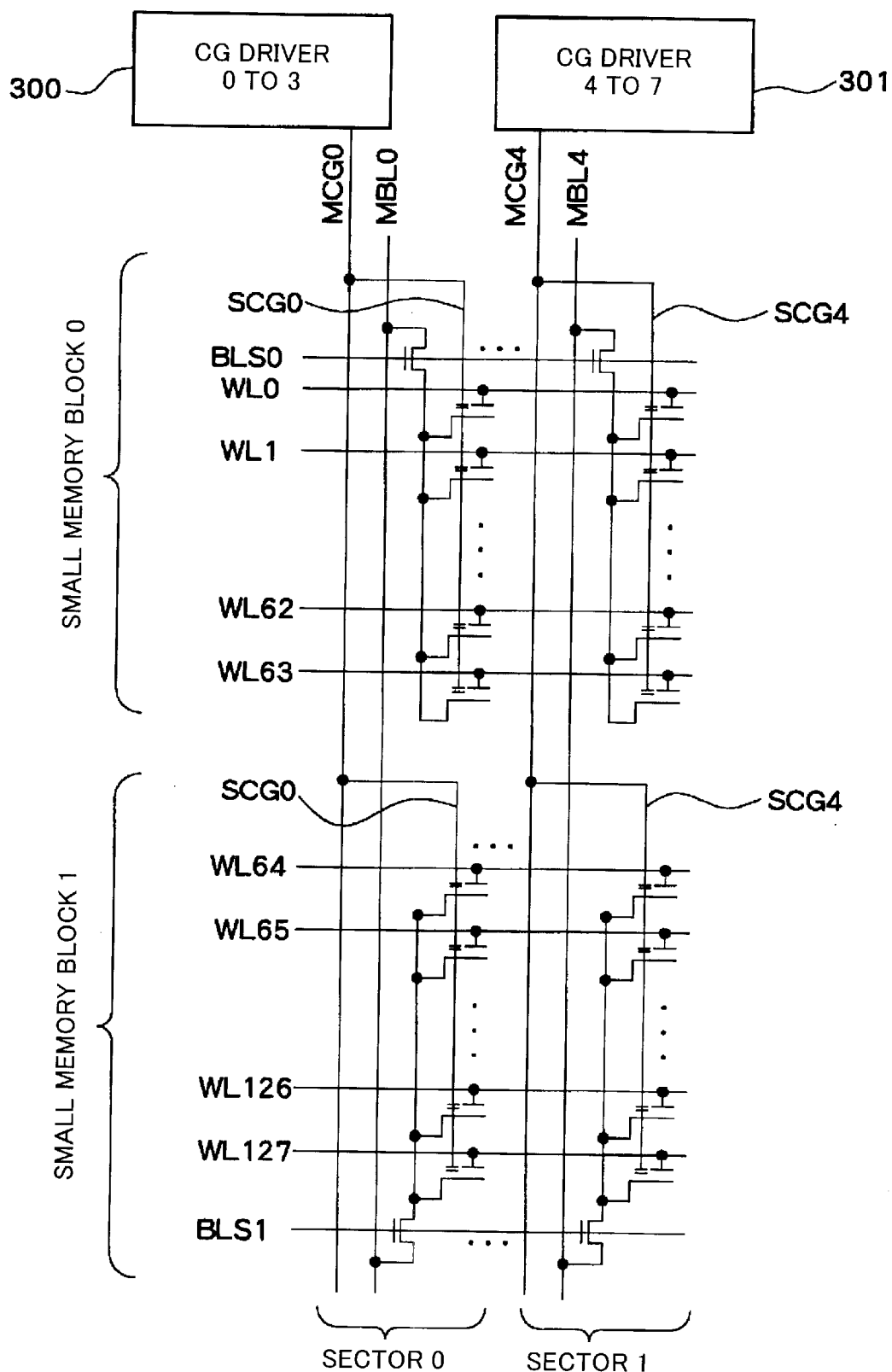

FIG. 9 is a circuit diagram showing the relation between the adjacent sector regions.

Figure 10:
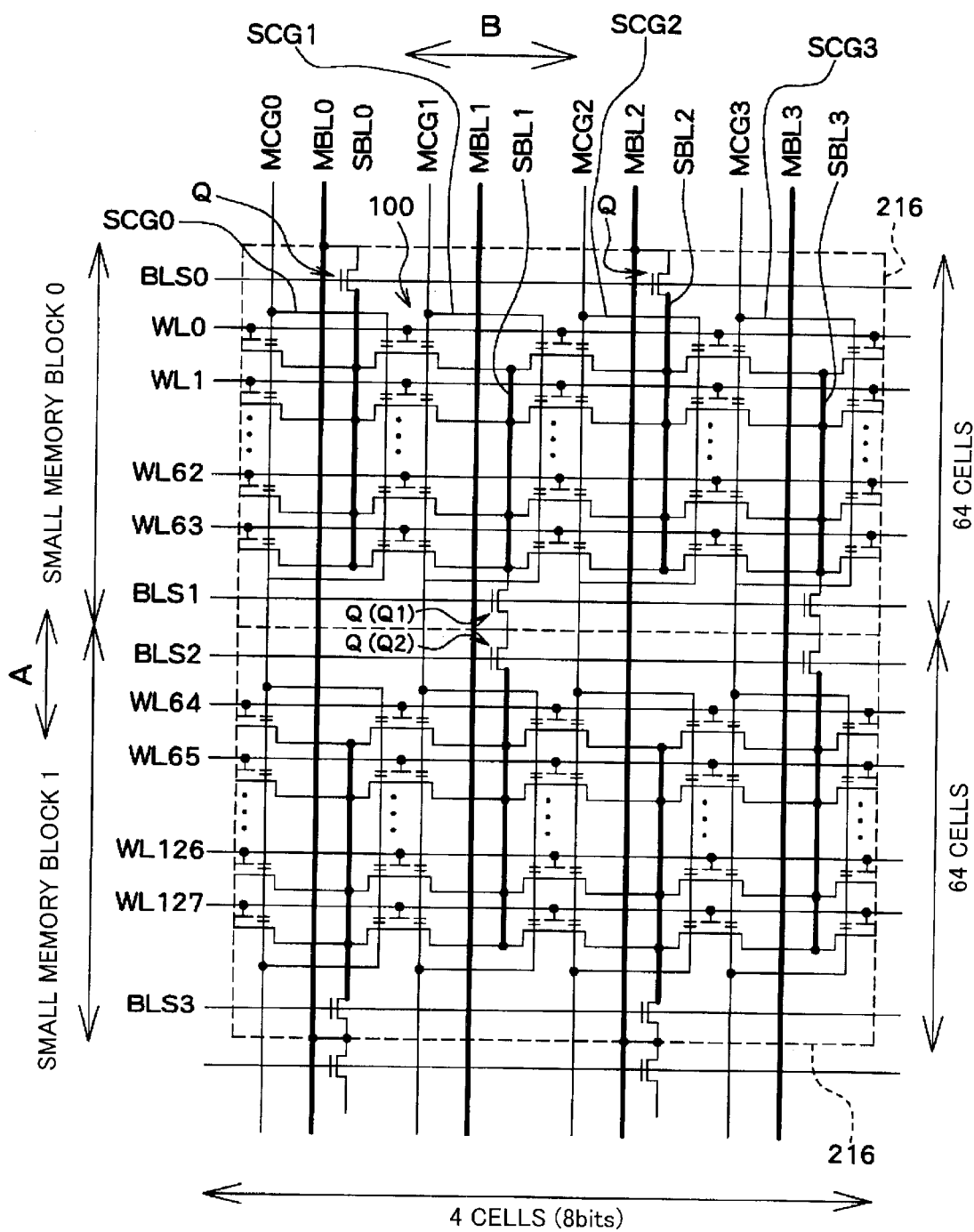

FIG. 10 is a schematic diagram for describing the memory cells in the memory cell array region and the interconnects for the memory cells.

Figure 11:
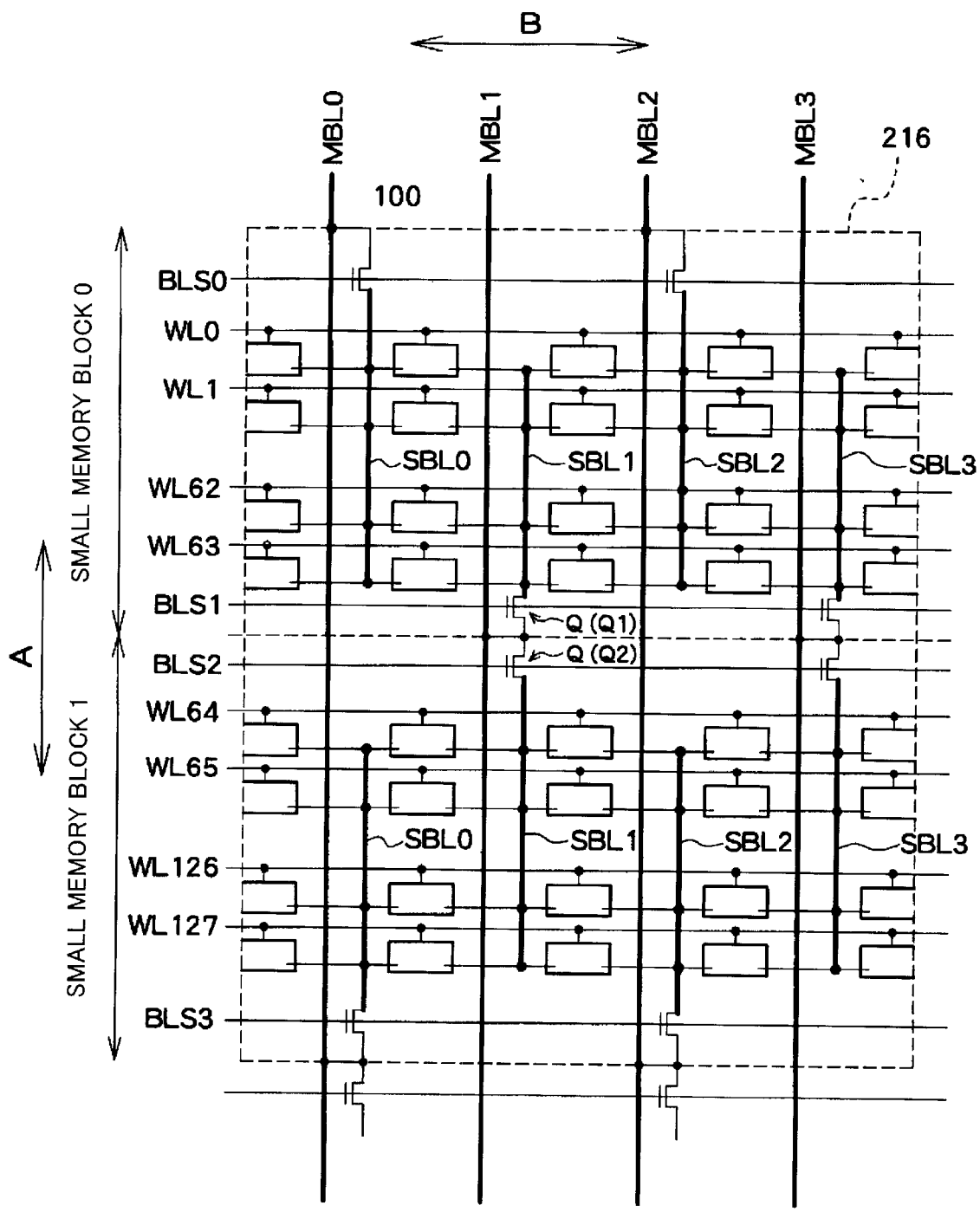

FIG. 11 is a wiring diagram showing the relation between sub bit lines and main bit lines in the memory cell array region shown in FIG. 10.

Figure 12:
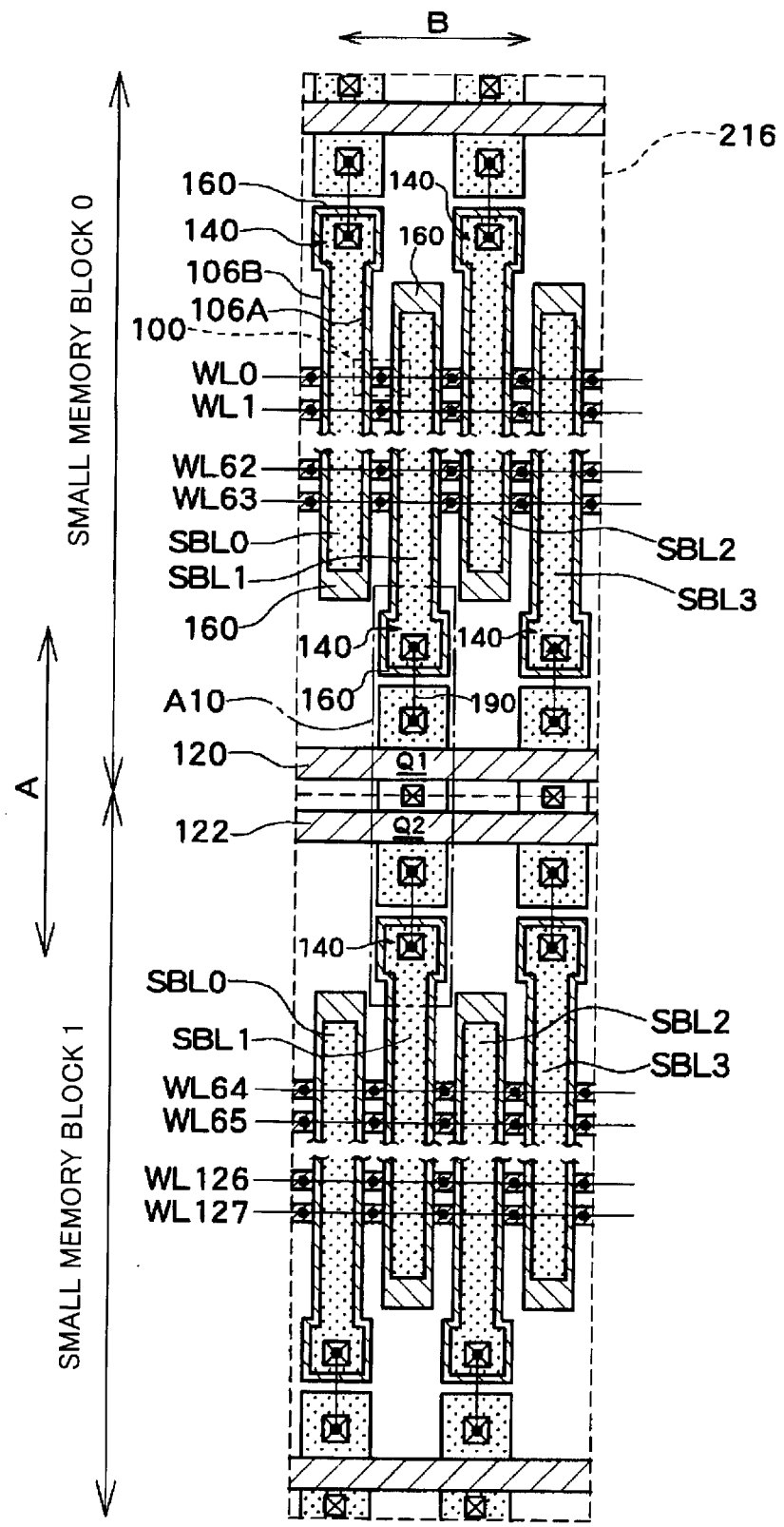

FIG. 12 is a plan view showing a first planar layout of the memory cell array region shown in FIGS. 10 and 11.

Figure 13:
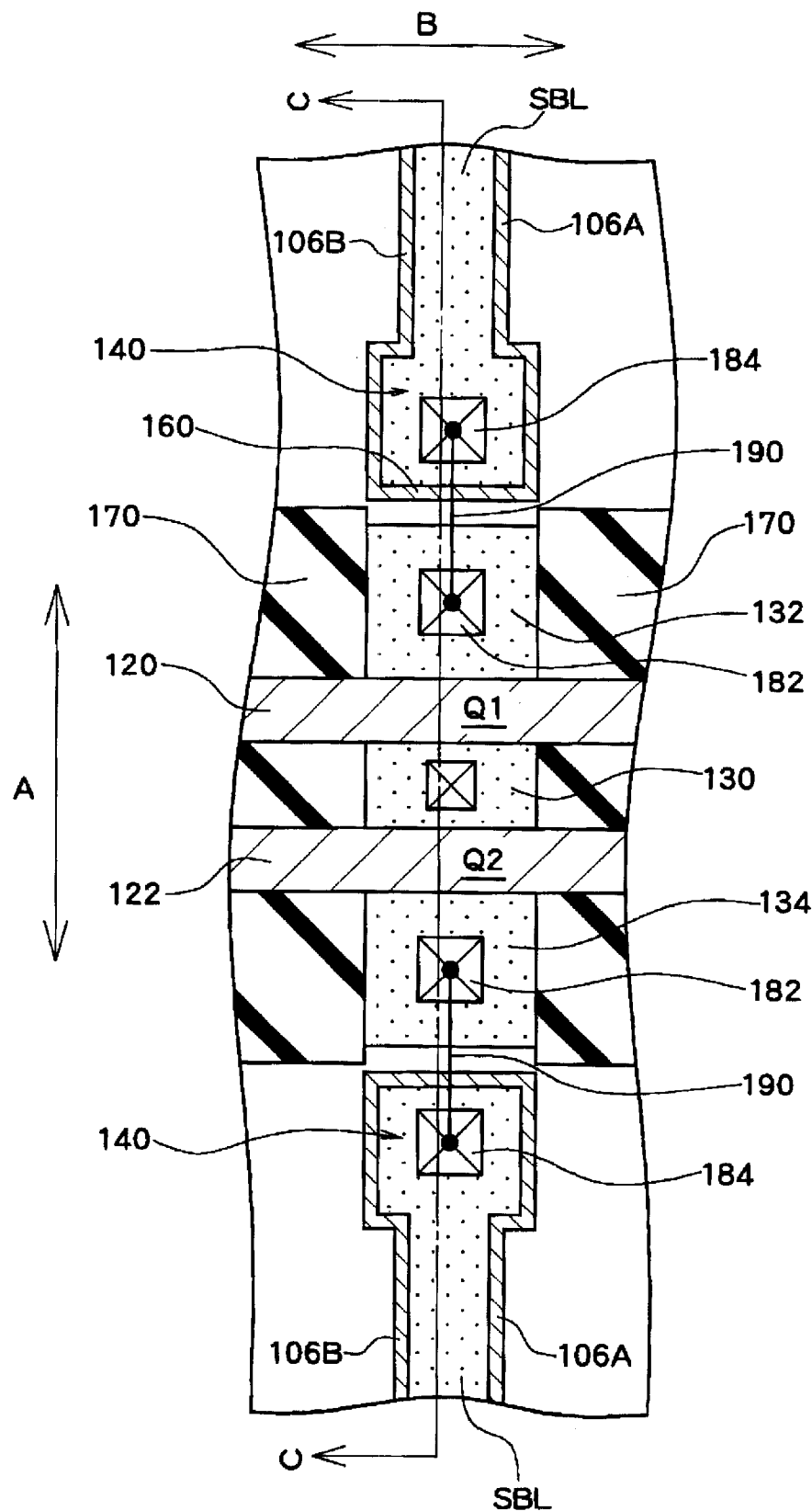

FIG. 13 is an enlarged plan view of a strap group region (region indicated by A10) shown in FIG. 12.

Figure 14:
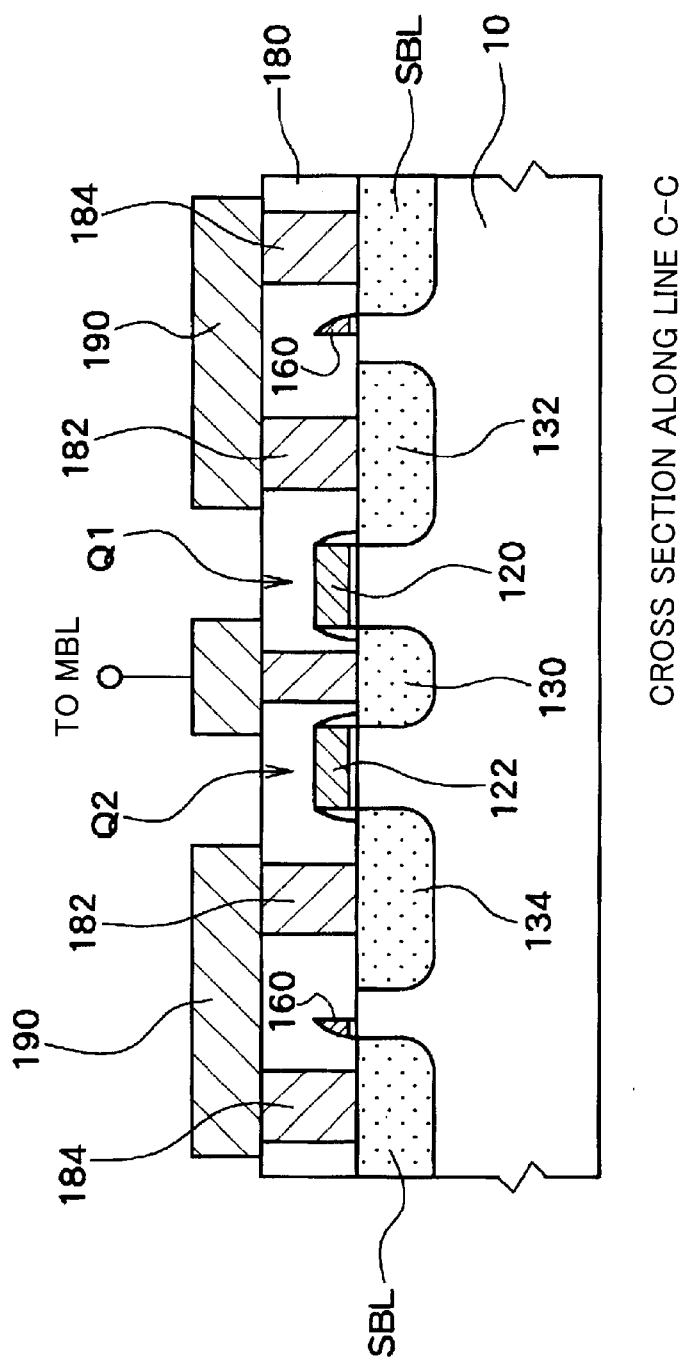

FIG. 14 is a cross-sectional view schematically showing the cross section along the line C—C shown in FIG. 13.

Figure 15:
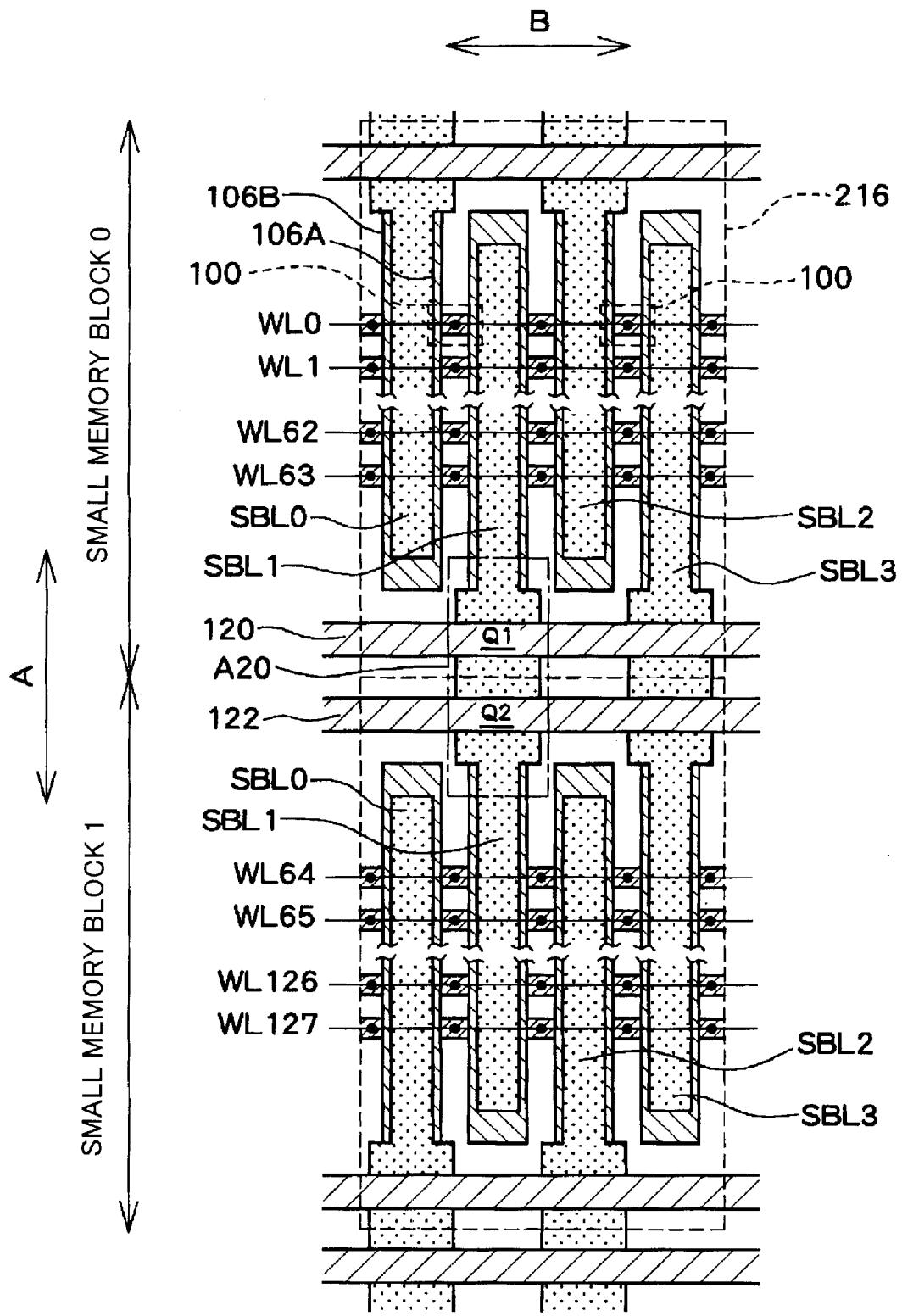

FIG. 15 is a plan view showing a second planar layout of the memory cell array region shown in FIGS. 10 and 11.

Figure 16:
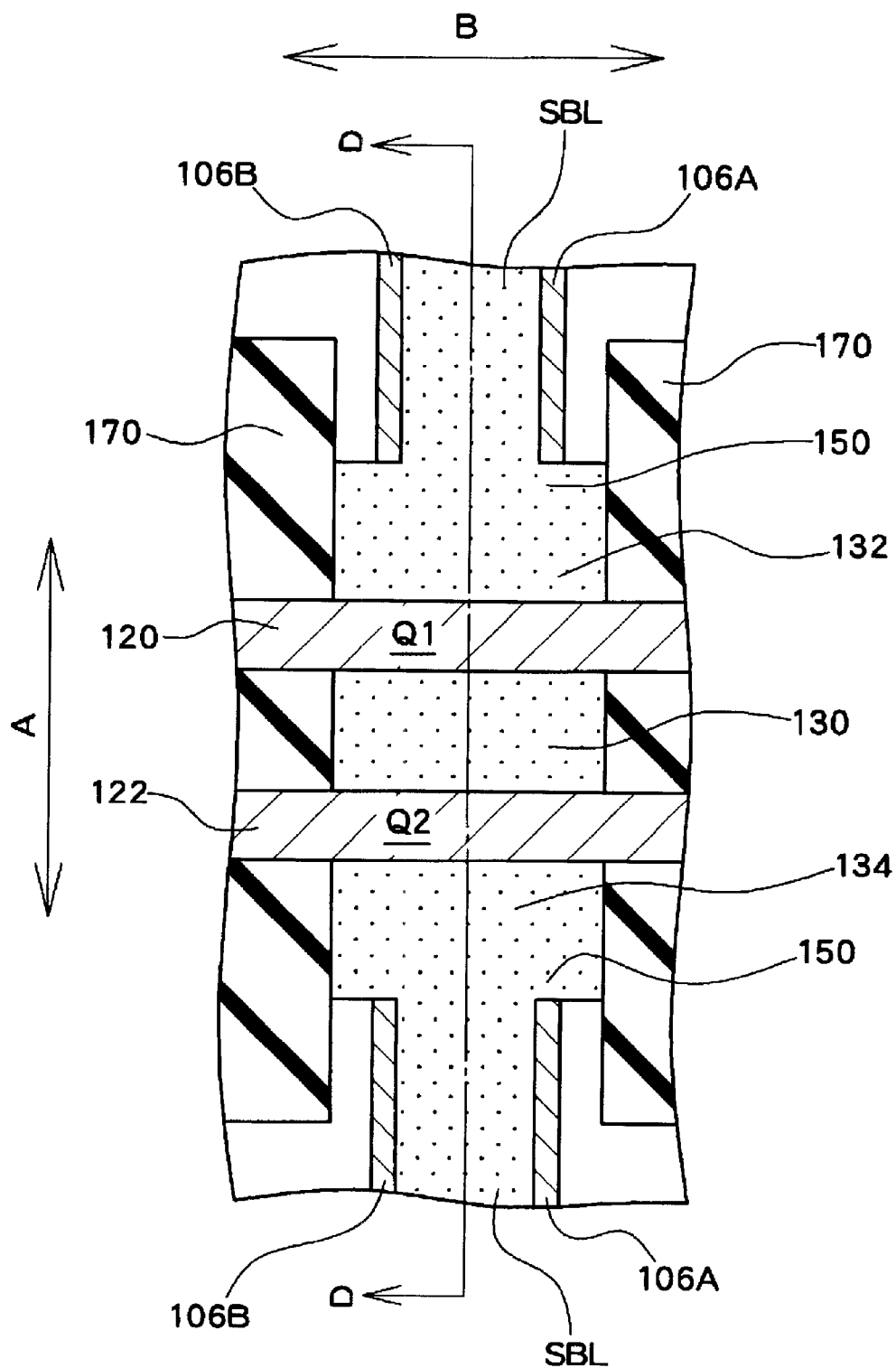

FIG. 16 is an enlarged plan view of a strap group region (region indicated by A20) shown in FIG. 15.

Figure 17:
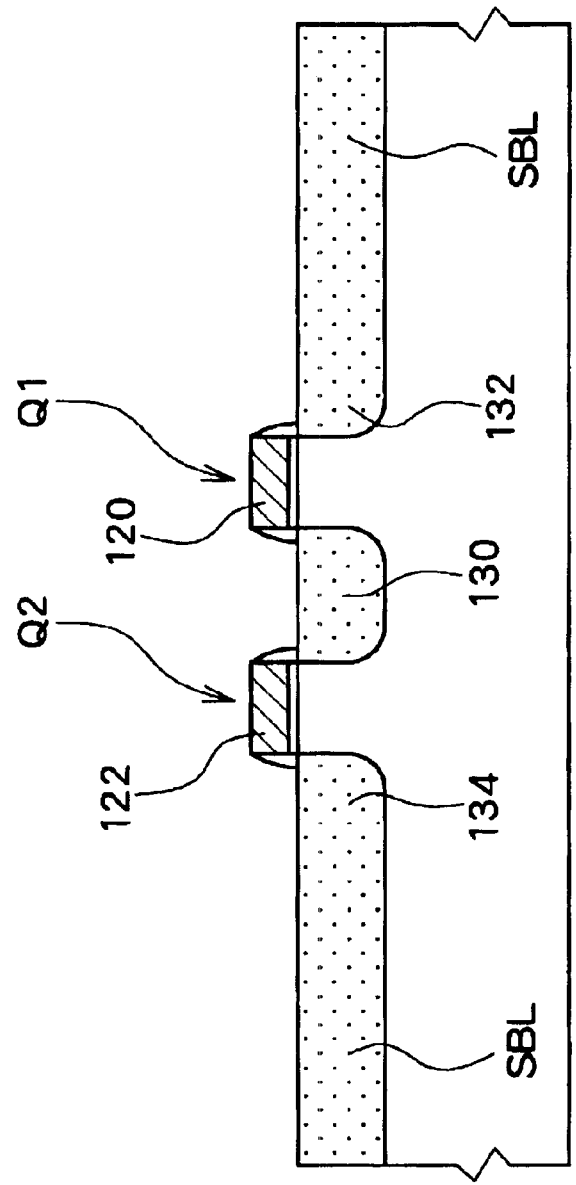

FIG. 17 is a cross-sectional view schematically showing the cross section along the line D—D shown in FIG. 16.

Figure 18:
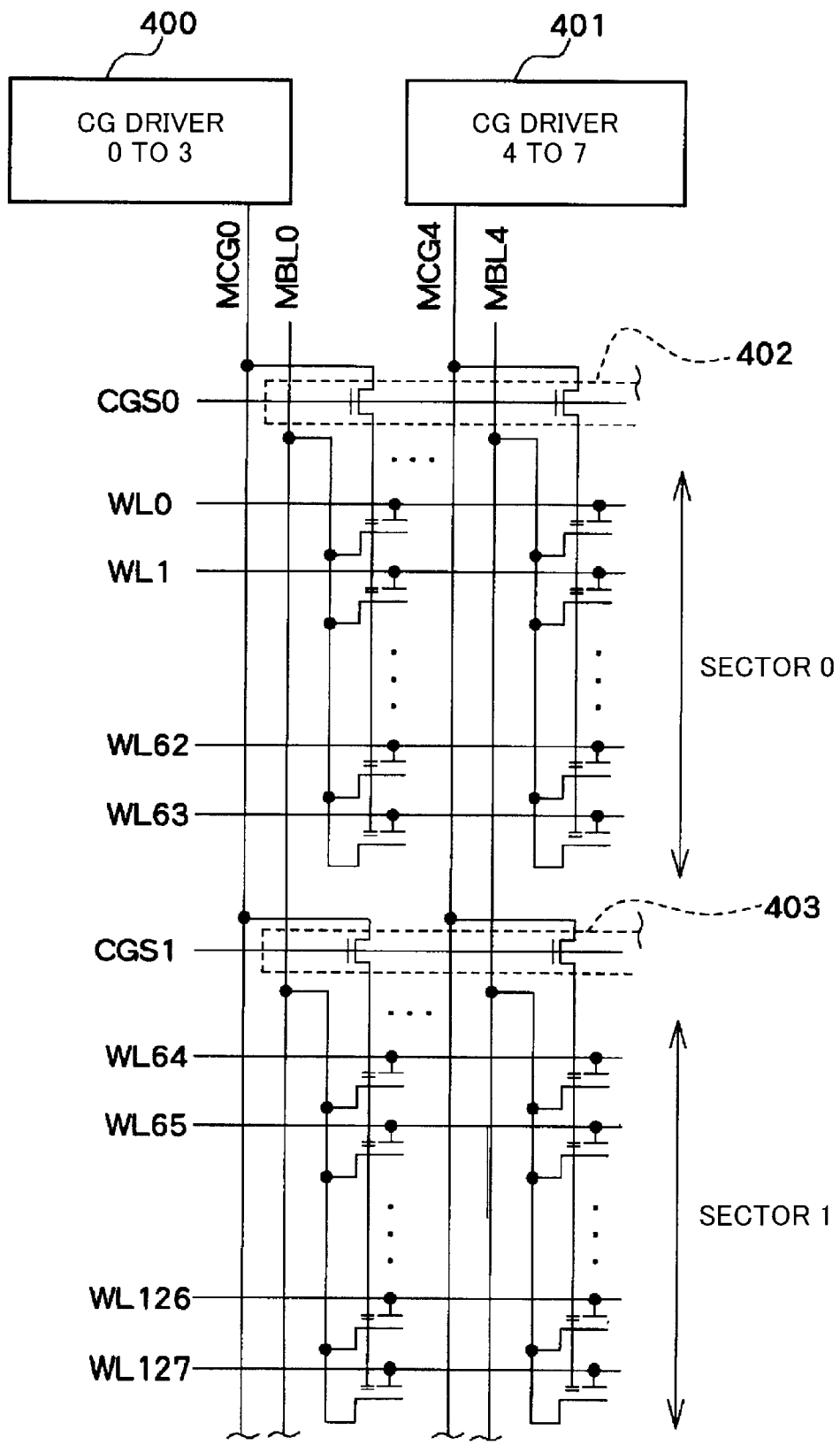

FIG. 18 is a circuit diagram showing the configuration of a comparative example for FIG. 9.

DETAILED DESCRIPTION OF THE EMBODIMENT

An embodiment of the present invention is described below with reference to the drawings.

Structure of Memory Cell

Figure 2:
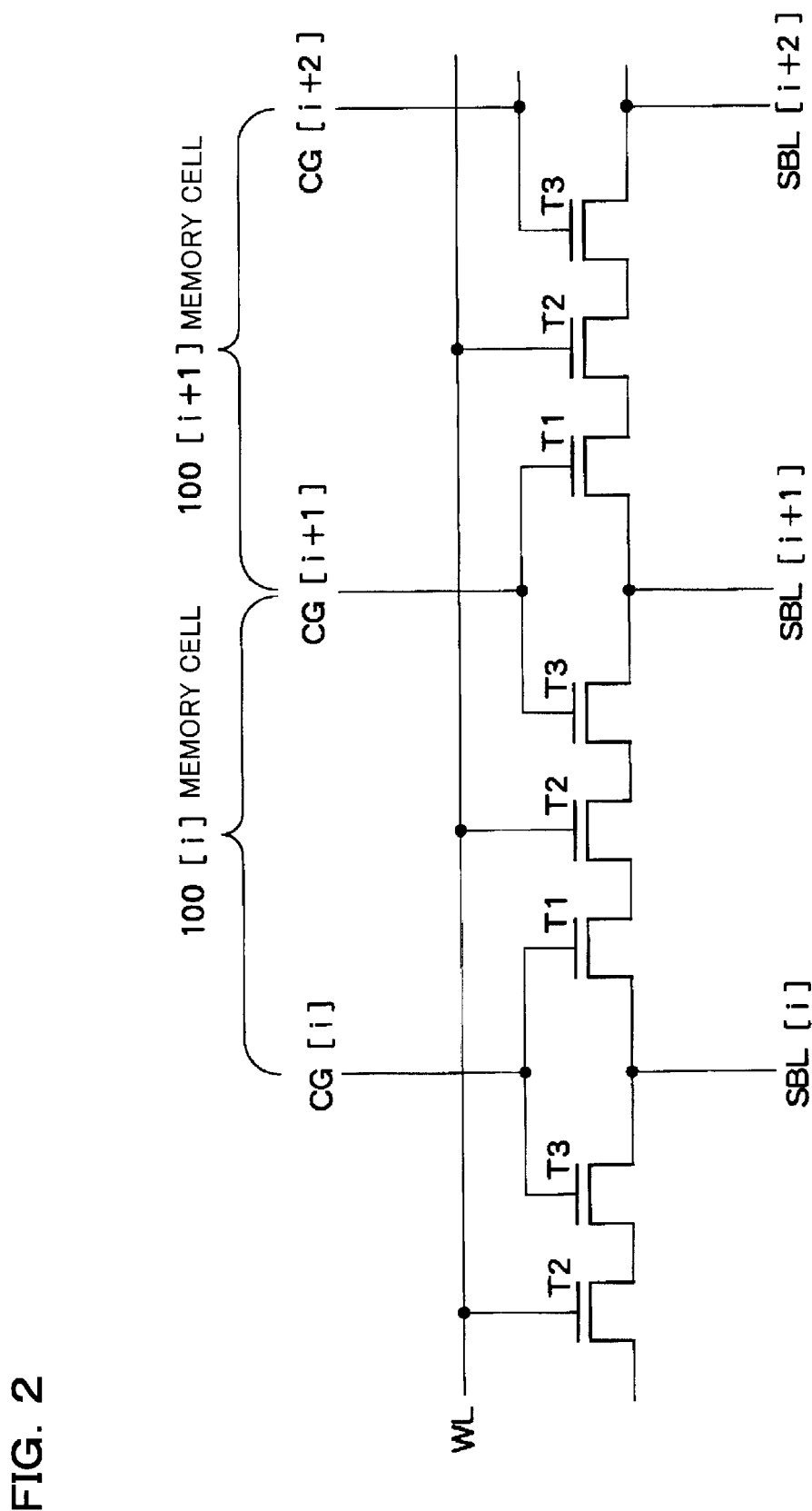
FIG. 2 is an equivalent circuit diagram of the memory cells shown in FIG. 1.

FIG. 1 is a view showing a cross section of a non-volatile semiconductor memory device. FIG. 2 is an equivalent circuit diagram of the non-volatile semiconductor memory device. In FIG. 1, one memory cell 100 includes a word gate 104 formed of a polycide or the like on a P-type well 102 through a gate insulating film, first and second control gates 106A and 106B, and first and second memory elements (MONOS memory cells) 108A and 108B.

The first and second control gates 106A and 106B are formed on opposite sidewalls of the word gate 104. The first and second control gates 106A and 106B are electrically insulated from the word gate 104.

Each of the first and second memory elements 108A and 108B is formed by layering an oxide film (O), nitride film (N), and oxide film (O) between either the first control gate 106A or the second control gate 106B formed of polysilicon corresponding to M (Metal) in the MONOS and the P-type well 102 corresponding to S. The first and second control gates 106A and 106B may be formed using a conductive material such as a silicide.

As described above, one memory cell 100 includes the first and second MONOS memory cells 108A and 108B, each having a split gate (first and second control gates 106A and 106B). One word gate 104 is shared by the first and second MONOS memory cells 108A and 108B.

The first and second MONOS memory cells 108A and 108B function as charge trap sites. Each of the first and second MONOS memory cells 108A and 108B can trap charges in the ONO film 109.

As shown in FIGS. 1 and 2, a plurality of word gates 104 arranged at intervals in the row direction (second direction B in FIGS. 1 and 2) is connected in common with one word line WL formed of a polycide or the like.

The control gates 106A and 106B shown in FIG. 1 extend along the column direction (first direction A perpendicular to the surface of FIG. 1) and are shared by a plurality of memory cells 100 arranged in the column direction. Therefore, the control gates 106A and 106B may be referred to as control gate lines.

A sub control gate line SCG [i+1] formed of a first metal layer in an upper layer of the word gate, control gate, and word line is, connected with the control gate line 106B in the [i] th memory cell 100 [i] and the control gate line 106A in the [i+1] st memory cell 100 [i+1].

An [i+1]st impurity layer 110 [i+1] shared by the MONOS memory cell 108B in the [i] th memory cell 100 [i] and the MONOS memory cell 108A in the [i+1] st memory cell 100 [i+1] is formed in the P-type well 102.

The impurity layers 110 [i], 110 [i+1], and 110 [i+2] are n-type impurity layers formed in the P-type well, for example. The impurity layers 110 [i], 110 [i+1], and 110 [i+2] function as sub bit lines which extend along the column direction (first direction A perpendicular to the surface of FIG. 1) and are shared by a plurality of memory cells 100 arranged in the column direction. Therefore, the impurity layers 110 [i], 110 [i+1], 110 [i+2] maybe referred to as sub bit lines SBL [i], SBL [i+1], and SBL [i+2].

Reading of Data From Memory Cell

As shown in FIG. 2, a transistor T2 driven by the word gate 104 and transistors T1 and T3 respectively driven by the first and second control gates 106A and 106B are connected in series in one memory cell 100.

Figure 3:
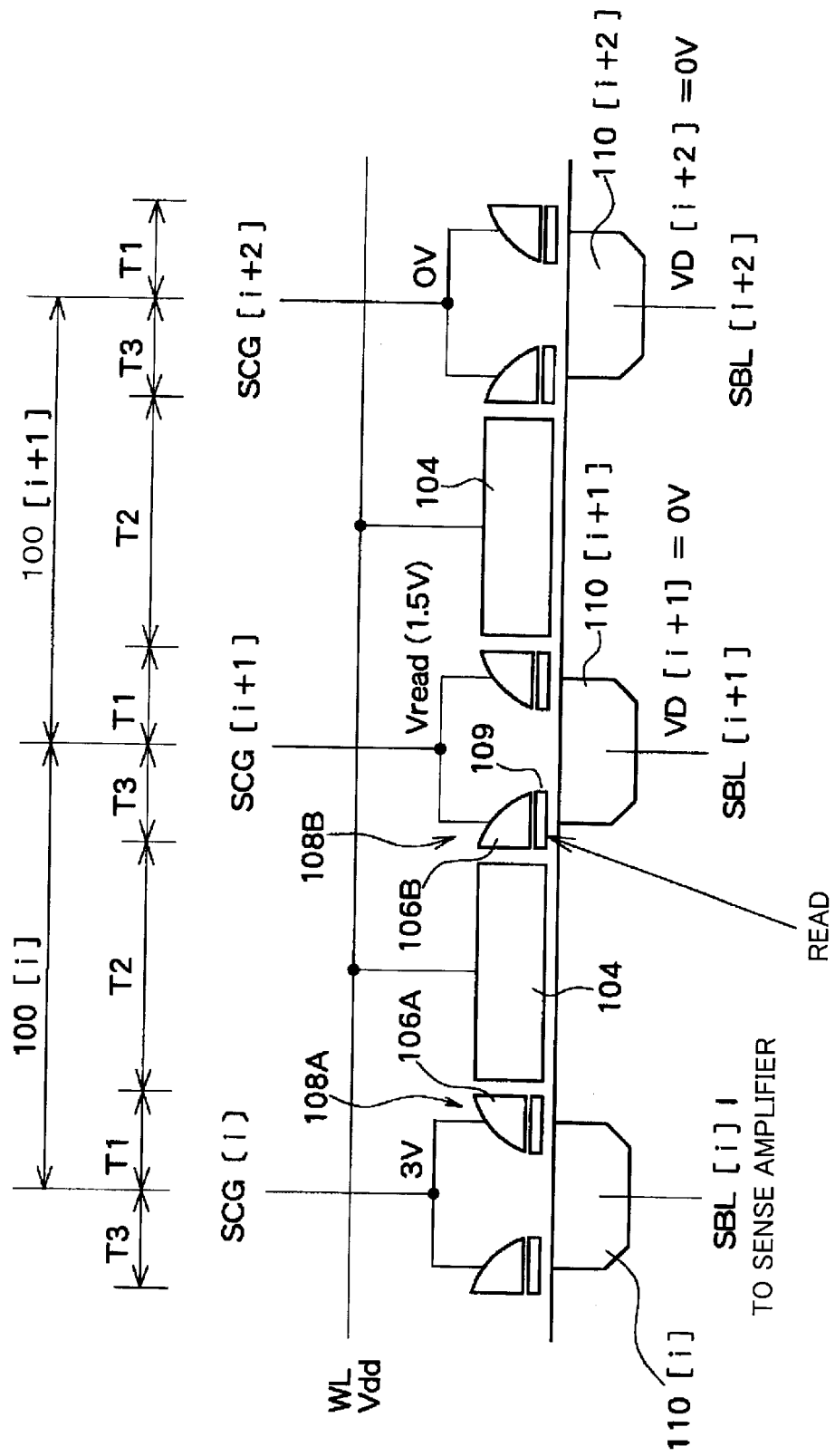
FIG. 3 is a schematic explanatory diagram for describing a data read operation of the non-volatile semiconductor memory device shown in FIG. 1.

Setting of the potential at each point of two adjacent memory cells 100 [i] and 100 [i+1] is described below with reference to FIG. 3. FIG. 3 is a view for describing reading of data from the MONOS memory cell 108B on the right of the word gate 104 in the memory cell 100 [i].

In this case, each of the transistors T2 is turned ON by applying a voltage Vdd (1.8 V, for example) to each of the word gates 104 in the same row as the memory cell 100 [i]. The transistor T1 corresponding to the MONOS memory cell 108A is turned ON by applying an override voltage (3 V, for example) to the control gate 106A on the left side of the memory cell 100 [i] through the sub control gate line SCG [i]. A read voltage Vread (1.5 V, for example) is applied as a potential VCG of the control gate 106B on the right side of the memory cell 100 [i].

The operation of the transistor T3 corresponding to the MONOS memory cell 108B differs as described below depending upon whether or not charges are stored in the MONOS memory cell 108B on the right of the word gate 104.

Figure 4:
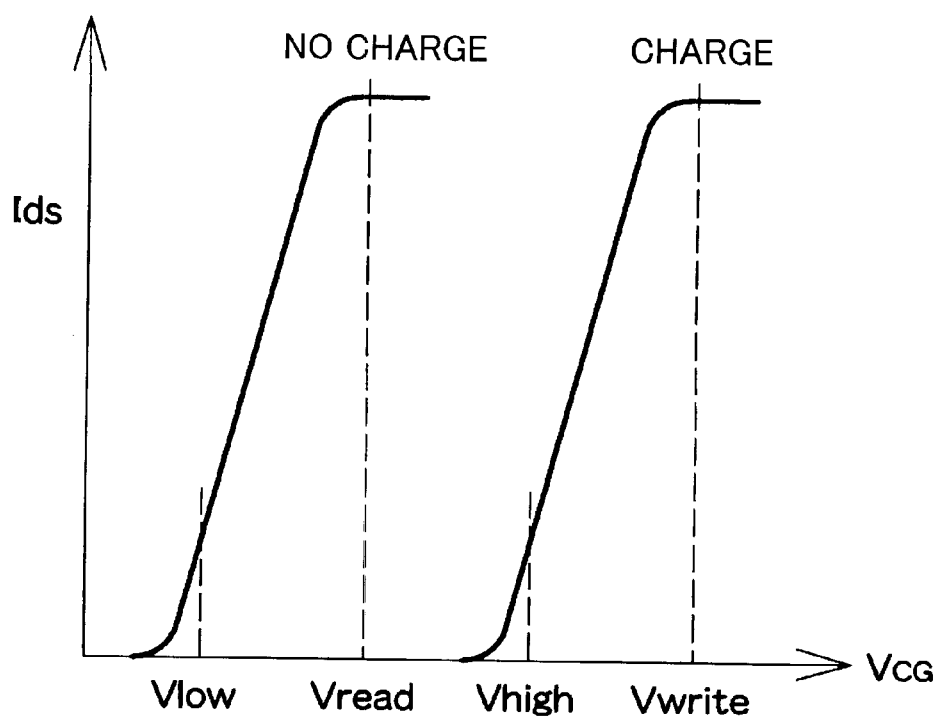
FIG. 4 is a characteristic diagram showing a relation between a control gate voltage VCG and a source-drain current Ids in the memory cells shown in FIG. 1.

FIG. 4 shows the relation between a voltage applied to the control gate 106B on the right side of the memory cell 100 [i] and a current Ids which flows between source/drain of the transistor T3 corresponding to the MONOS memory cell 108B controlled by this voltage.

As shown in FIG. 4, in the case where charges are not stored in the MONOS memory cell 108B, the current Ids starts to flow when the control gate potential VCG exceeds a lower threshold voltage Vlow. In the case where charges are stored in the MONOS memory cell 108B, the current Ids does not start to flow unless the control gate potential VCG exceeds a higher threshold voltage Vhigh.

The voltage Vread applied to the control gate 106B at the time of reading data is set to approximately an intermediate voltage between the two threshold voltages Vlow and Vhigh.

Therefore, the current Ids flows if charges are not stored in the MONOS memory cell 108B, and the current Ids does not flow if charges are stored in the MONOS memory cell 108B.

At the time of reading data, a potential VD [i] of the sub bit line SBL [i] (impurity layer 110[i]) is set to the sense amplifier and the potential VD [i+1] of the sub bit line SBL [i+1] (impurity layer 110 [i+1]) is set to 0 V. This allows the current Ids to flow when charges are not stored in the MONOS memory element 108B (selected side), whereby a current of 25 μA or more flows through the sub bit line SBL [i] on the opposite side through the transistors T1 and T2 in an ON state, for example. Since the current Ids does not flow when charges are stored in the MONOS memory element 108B (selected side), current flowing through the sub bit line SBL [i] on the opposite side is less than 10 nA even if the transistors T1 and T2 are in an ON state, for example. Therefore, data can be read from the MONOS memory element 108B (selected side) in the memory cell 100 [i] by detecting the current flowing through the sub bit line SBL [i] on the opposite side using the sense amplifier.

The transistors T1 and T2 are turned ON in the memory cell 100 [i+1]. However, since the control gate potential VCG of the transistor T3 is set to 0 V, which is lower than the threshold voltages Vlow and Vhigh shown in FIG. 3, the source-drain current does not flow in the memory cell 100 [i+1]. Therefore, data storage conditions in the memory cell 100 [i+1] do not adversely affect the reading of data from the memory cell 100 [i].

In the case of reading data from the MONOS memory cell 108A on the left side of the memory cell 100 [i], the potential at each point of the memory cell 100 [i−1] and [i] may be set in the same manner as described above.

Programming of Memory Cell

Figure 5:
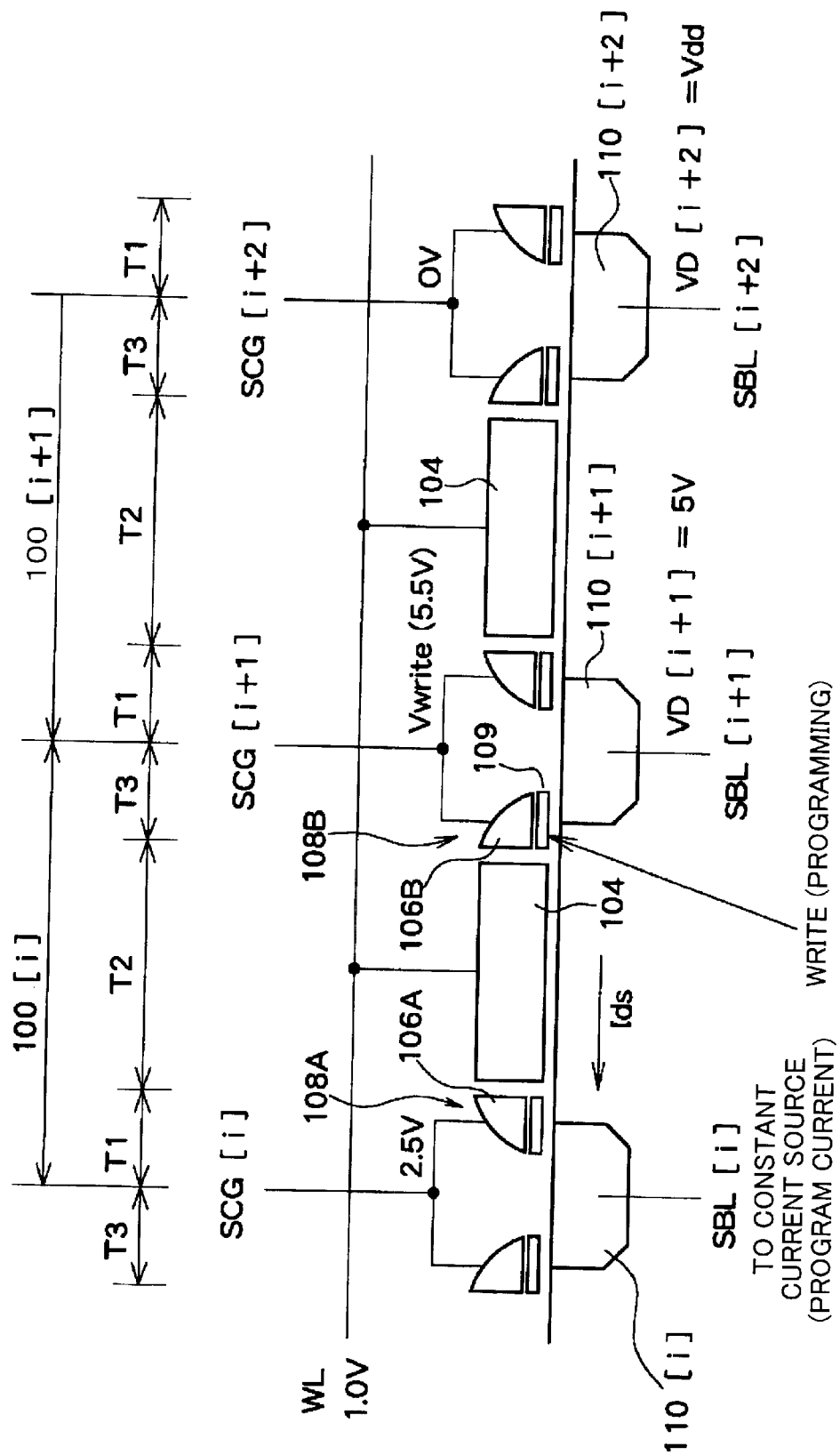
FIG. 5 is a schematic explanatory diagram for describing a data write (program) operation of the non-volatile semiconductor memory device shown in FIG. 1.

FIG. 5 is a view for describing data programming of the MONOS memory cell 108B on the right of the word gate 104 in the memory cell 100 [i]. A data erase operation described later has been performed before this data program operation.

In FIG. 5, the potential of the sub control gate line SCG [i] is set to the override potential (2.5 V, for example) and the potential of the sub control gate line SCG [i+2] is set to 0 V in the same manner as shown in FIG. 3. The potential of each word gate 104 is set to a programming word line select voltage which is lower than the power supply voltage Vdd (about 1.0 V, for example) by the word line WL. The potential of the control gate 106B on the right side of the memory cell 100 [i+1] is set to a write potential Vwrite (5.5 V, for example) shown in FIG. 4 through the sub control gate line SCG [i+1]. The potential VD [i+1] of the [i+1] st impurity layer 110 [i+1] (sub bit line SBL [i+1]) is set to 5 V, for example. The potential VD [i] of the [i] th impurity layer 110 [i] (sub bit line SBL [i]) is set to 0 V, for example.

This causes the transistors T1 and T2 in the memory cell 100 [i] to be turned ON, whereby the current Ids flows toward the impurity layer 110 [i]. At the same time, channel hot electrons (CHE) are trapped in the ONO film 109 of the MONOS memory cell 108B. The program operation of the MONOS memory cell 108B is performed in this manner, whereby data "0" or "1" is written in.

Erasing of Data in Memory Cell

Figure 6:
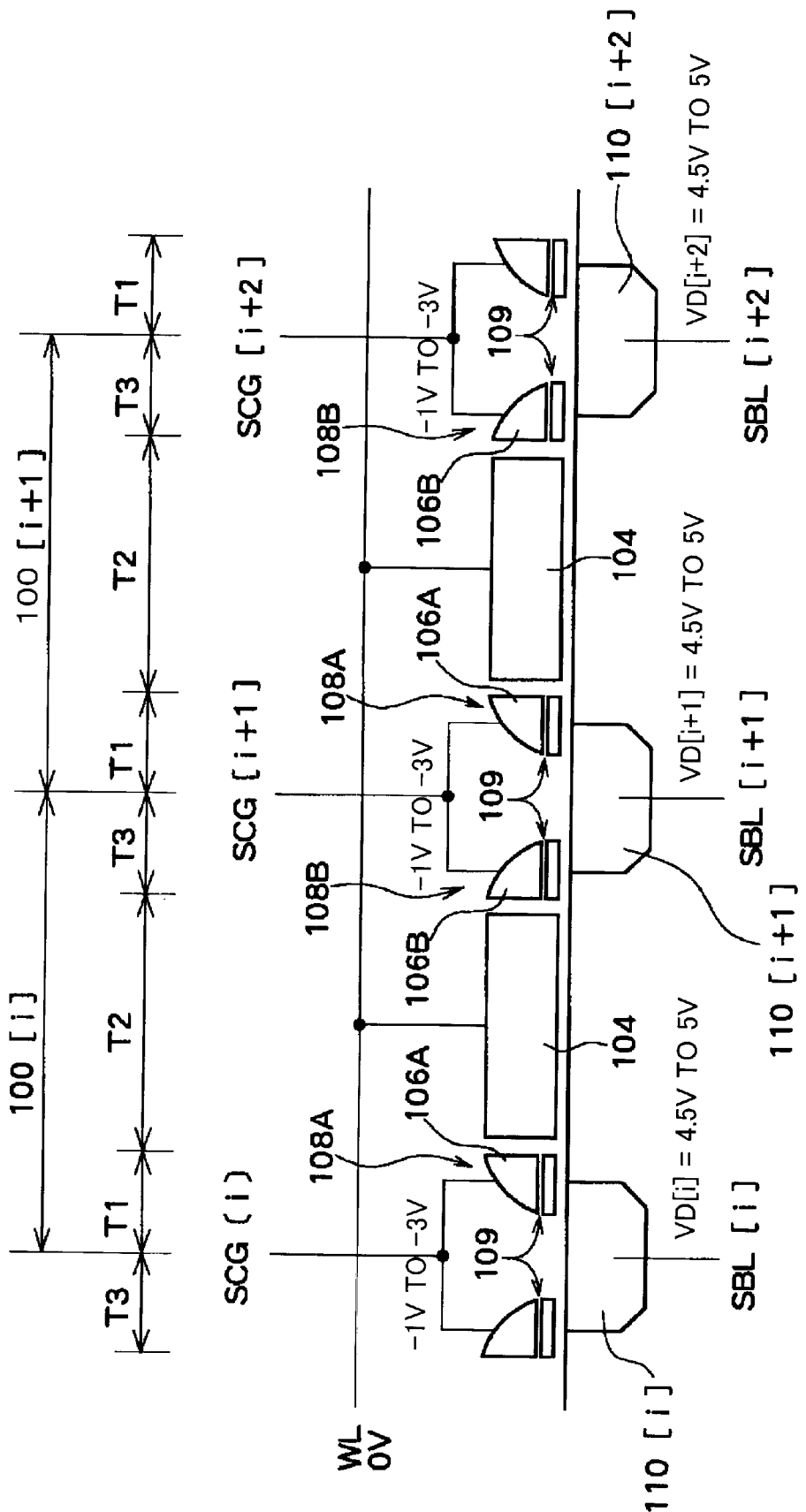
FIG. 6 is a schematic explanatory diagram for describing a data erase operation of the non-volatile semiconductor memory device shown in FIG. 1.

FIG. 6 is a view for describing data erase of the memory cells 100 [i] and [i+1] connected with the word line WL.

In FIG. 6, the potential of each word gate 104 is set to 0 V by the word line WL, for example. The potential of the control gates 106A and 106B is set to about −1 to −3 V (first high potential for erasing) by the sub control gate lines SCG [i], [i+1], and [i+2], for example. The potential of the impurity layers (bit lines) 110 [i], 110 [i+1], and 110 [i+2] is set to 4.5–5 V (second high potential for erasing) equal to the potential of the P-type well.

This causes electrons trapped in the ONO films 109 of the MONOS memory cells 108A and 108B to be extracted and erased by a tunnel effect caused by an electric field formed by the first high potential for erasing being applied to the metal (M) and the second high potential for erasing being applied to the silicon (S). This enables data to be erased in a plurality of memory cells at the same time. Differing from the above example, the stored electrons may be erased by forming hot holes using band—band tunneling on the surface of the impurity layers which become the bit lines.

Entire Configuration of Non-Volatile Semiconductor Memory Device

The entire configuration of the non-volatile semiconductor memory device formed by using the above-described memory cells 100 is described below with reference to FIGS. 7A to 7E.

FIG. 7A is a view showing a planar layout of one chip of non-volatile semiconductor memory device. Each of memory cell array regions 200A and 200B on either side of a word line driver section 201 is divided into 32 sector regions 210, for example. One chip of non-volatile semiconductor memory device has the 0th to 63rd sector regions 210.

As shown in FIG. 7A, each of the memory cell array regions 200A and 200B on either side is divided into 32 sector regions 210 in the second direction (row direction) B. Each of the sector regions 210 has a rectangular shape in which the first direction (column direction) A is the longitudinal direction. The sector region 210 is a minimum unit for data erasing. Data stored in the sector region 210 is collectively erased.

Each of the memory array regions 200A and 200B has 4K word lines WL and 2K sub bit lines SBL, for example. In the present embodiment, since two MONOS memory cells 108A and 108B are connected with one sub bit line SBL, 2K sub bit lines SBL mean a storage capacity of 4 Kbits. Since the non-volatile semiconductor memory device shown in FIG. 7A has the memory array regions 200A and 200B on either side, the non-volatile semiconductor memory device has a storage capacity defined by (4K word lines WL)×(2K sub bit lines SBL)×2×2 as the entire memory. The storage capacity of each sector region 210 is 1/64 of the storage capacity of the entire memory. Each sector region 210 has a storage capacity defined by (4K word lines WL)×(64 sub bit lines SBL)×2.

FIG. 7B is a view showing the details of one sector region 210 of the non-volatile semiconductor memory device shown in FIG. 7A. As shown in FIG. 7B, each sector region 210 is divided in the second direction and has memory blocks for I/O0–I/O15 (memory blocks corresponding to input/output bits) 214 so that 16-bit data can be read from or written in the memory blocks.

As shown in FIG. 7B, each memory block 214 has 4k (4096) word lines WL. As shown in FIG. 7C, the sector region 210 is divided into eight large blocks 212 in the first direction A. Each of the large blocks 212 is divided into eight small blocks 215 in the first direction A, as shown in FIG. 7D.

As shown in FIG. 7E, each small block 215 has 64 word lines WL. Each small block 215 consists of 16 small memory blocks 216 arranged along the row direction.

Therefore, the total number of word lines WL arranged in one large block 212 (including the word lines for redundancy) is 64×8 (small block)=512. Therefore, the total number of word lines WL arranged in one sector region 210 is 512×8 (large block)=4096.

Details of Sector Region

FIG. 8 is a view showing the details of the sector region 0 shown in FIG. 7A and a CG driver.

As shown in FIG. 8, 64 small memory blocks 216 are arranged in the column direction in one sector region 0. 16 small memory blocks 216 are arranged in the row direction corresponding to the I/O0–I/O15 for performing 16-bit input/output.

16 sub control gate lines SCG0 of 16 small memory blocks 216 arranged in the row direction are connected in common with a second metal interconnect layer M0 extending in the row direction, for example. 16 sub control gate lines SCG1, 16 sub control gate lines SCG2, and 16 sub control gate lines SCG3 are respectively connected in common with a metal interconnect M1, metal interconnect M2, and metal interconnect M3.

A CG driver 300 is provided as a control gate drive section of the sector region 0. Four main control gate lines MCG0–MCG3 are formed to extend from the CG driver 300 in the column direction. The main control gate lines MCG0–MCG3 are formed of a third metal interconnect layer, for example.

FIG. 9 is a view showing the relation between the sector region 0 and the sector region 1 adjacent thereto. The word lines WL are shared by the sector region 0 and the sector region 1. However, the main control gate lines MCG and the main bit lines MBL are separately provided in the sector region 0 and the sector region 1. The CG driver 300 corresponding to the sector region 0 and a CG driver 301 corresponding to the sector region 1 are illustrated in FIG. 9. The CG drivers are separately formed for each sector region.

Taking the sector 0 as an example, a plurality of sub control gate lines SCG0 disposed for each small memory block 216 is connected in common with the main control gate line MCG0. A gate circuit is not disposed in the route from the main control gate line MCG0 to the sub control gate line SCG0. This also applies to sector regions other than the sector region 0.

Configuration of Small Memory Block

The small memory block 216 is described below in detail. FIG. 10 is a schematic circuit diagram for describing the memory cells in the memory cell array region including the small memory blocks and interconnects for the memory cells. FIG. 11 is a circuit wiring diagram clearly showing the relation between the sub bit lines and the main bit lines in the memory cell array region shown in FIG. 10.

In the small memory block 216, 64 memory cells 100 are arranged in the column direction and four memory cells 100 are arranged in the row direction, for example. Four sub control gate lines SCG0–SCG3 formed of polysilicon in the shape of a sidewall, for example, four sub bit lines SBL0–SBL3 which are data input/output lines, and 64 word lines WL are connected to one small memory block 216.

The second control gates 106B of a plurality of memory cells in the even-numbered rows (0th row or second row) and the first control gates 106A of a plurality of memory cells in the odd-numbered rows (first row or third row) are connected in common with the even-numbered sub control gate lines SCG0 and SCG2. The second control gates 106B of a plurality of memory cells in the odd-numbered rows (first row or third row) and the first control gates 106A of a plurality of memory cells in the even-numbered rows (second row or fourth row) are connected in common with the odd-numbered sub control gate lines SCG1 and SCG3.

Each of the sub bit lines SBL0–SBL3 extends along the first direction (column direction) A and is connected in common with a plurality of memory cells formed on either side. Each of the sub bit lines SBL0–SBL3 is connected with one of a plurality of main bit lines MBL0–MBL3.

As shown in FIGS. 10 and 11, switching elements Q which select connection/disconnection between the sub bit lines SBL and the main bit lines MBL are formed at connection points between the sub bit lines SBL and the main bit lines MBL. The switching elements Q are formed on the end portion of the sub bit lines SBL. The switching elements Q are turned ON/OFF based on the potential of select signal lines BLS. When the switching element Q is turned ON, the sub bit line SBL and the main bit line MBL are in a conducting state in the selected small memory block 216. The sub bit line SBL in the non-selected small memory block 216 is in a floating state.

Each of the switching elements Q is connected with one of the end portions of the even-numbered sub bit lines SBL0 and SBL2 and to the opposite end portions of the odd-numbered sub bit lines SBL1 and SBL3. Specifically, the switching elements Q of the even-numbered sub bit lines SBL0 and SBL2 and the switching elements Q of the odd-numbered sub bit lines SBL1 and SBL3 are formed on opposite end portions.

One of the switching elements Q disposed in two small memory blocks 216 adjacent in the first direction A is referred to as a first select transistor Q1, and the other is referred to as a second select transistor Q2. The first and second select transistors Q1 and Q2 connected with the same main bit line MBL are formed next to each other.

The features of the present embodiment in this section are described below.

(1) The sub bit line SBL is connected with the main bit line MBL through the switching element Q. Therefore, the selected sub bit line SBL and the main bit line MBL can be in a conducting state, and the non-selected sub bit line SBL and the above main bit line MBL can be in a nonconducting state. As a result, interconnect capacitance of the sub bit line SBL at the time of reading/writing can be decreased, whereby the memory cells can-be accessed at a higher speed at the time of reading/writing.

(2) The switching elements Q are formed on one end portion of the even-numbered sub bit lines SBL0 and SBL2 and the opposite end portions of the odd-numbered sub bit lines SBL1 and SBL3. This enables the following actions and effects to be obtained.

(2-1) The distance between one of the switching elements Q and the memory cell 100 and the distance between the other switching element Q and the memory cell 100 are equal between each memory cell 100. Therefore, the sum of the resistance of the sub bit lines SBL is equal between each memory cell 100. As a result, the potential difference applied between the source-drain is fixed between each memory cell 100, whereby unevenness of the characteristics can be reduced.

(2-2) Since the switching elements Q of the odd-numbered sub bit lines SBL can be disposed in the space between the even-numbered sub bit lines SBL, the channel width of the switching elements Q of the odd-numbered sub bit lines SBL can be increased. Similarly, the channel width of the switching elements Q of the even-numbered sub bit lines SBL can be increased.

(2-3) The first and second select transistors Q1 and Q2 connected with the same main bit line MBL are formed next to each other. This enables the impurity layer of the select transistors to be shared. As a result, the degree of integration of the memory can be increased.

The planar layout of the small memory block is described below. Two examples of the planar layout of the small memory block are illustrated below.

First Planar Layout of Small Memory Block

FIG. 12 is a view showing a planar layout of the nonvolatile semiconductor memory device in bulk shown in FIGS. 10 and 11. In FIG. 12, the word lines WL and local interconnect layers 190 are schematically indicated by lines.

Each of the sub bit lines SBL0–SBL3 consists of sub bit impurity layers formed in the semiconductor substrate. Each of the sub bit lines SBL has a projecting portion 140 which projects in the first direction A outside the end portion of the adjacent sub bit line SBL. The projecting portion 140 has a large-width region having a width greater than the width of the sub bit line SBL in the region in which the memory cells 100 are formed.

In the even-numbered sub bit lines SBL0 and SBL2, the projecting portions 140 are formed on one of the end portions of the sub bit lines. In the odd-numbered sub bit lines SBL1 and SBL3, the projecting portions 140 are formed on the opposite end portions of the sub bit lines. The projecting portions 140 of two sub bit lines SBL adjacent in the first direction A are formed to face each other.

The first control gate 106A and the second control gate 106B are formed on either side of each of the sub bit lines SBL0–SBL3. The first and second control gates 106A and 106B formed on either side of the sub bit line SBL have two continuous portions 160 in which the end portions of the first and second control gates 106A and 106B are connected.

Strap group regions A10 are formed between the sub bit lines SBL adjacent in the first direction (column direction) A (for example, between the sub bit line SBL1 in the small memory block 0 and the sub bit line SBL1 in the small memory block 1).

The first and second select transistors Q1 and Q2 are formed in each strap group region A10. The first select transistor Q1 is formed at a position facing the projecting portion 140 on one side of the strap group region A10. The second select transistor Q2 is formed at a position facing the projecting portion 140 on the other side of the strap group region A10.

The first select transistor Q1 selects connection/disconnection between the sub bit line SBL on one side of the strap group region A10 and the main bit line MBL. The second select transistor Q2 selects connection/disconnection between the sub bit line SBL on the other side of the strap group region A10 and the main bit line MBL. The select transistors Q1 and Q2 may be formed by field effect transistors (MOS transistors, for example).

The strap group region A10 is described below in detail with reference to FIG. 13. FIG. 13 is an enlarged plan view of the strap group region A10 shown in FIG. 12. FIG. 14 is a cross-sectional view schematically showing the cross section along the line C—C shown in FIG. 13. In FIG. 13, the local interconnect layers 190 are schematically indicated by lines.

The strap group region A10 includes first and second gate electrodes 120 and 122 and first to third impurity layers 130, 132, and 134. In the case where the sub bit lines SBL are formed of n-type impurity layers, conductivity type of the first to third impurity layers 130, 132, and 134 is n-type.

The regions of the select transistors Q1 and Q2 in the strap group region A10 are specified by element isolation regions 170.

The first and second gate electrodes 120 and 122 extend in the second direction B. The first impurity layer 130 is formed between the first and second gate electrodes 120 and 122. The first impurity layer 130 functions as a source or drain of the first and second select transistors Q1 and Q2. The first impurity layer 130 is shared by the first and second select transistors Q1 and Q2.

The second impurity layer 132 is formed between the first gate electrode 120 and one of the sub bit lines (sub bit impurity layer) SBL. The second impurity layer 132 functions as the source or drain of the first select transistor Q1. The third impurity layer 134 is formed between the second gate electrode 122 and the other sub bit line (sub bit impurity layer) SBL. The third impurity layer 134 functions as the source or drain of the second select transistor Q2.

As shown in FIGS. 13 and 14, the second impurity layer 132 and the sub bit line SBL are electrically connected through two contact portions 182 and 184 formed in an interlayer dielectric and the local interconnect layer 190 formed of metal interconnects.

The third impurity layer 134 and the sub bit line SBL (sub bit impurity layer) are electrically connected through two contact portions 182 and 184 formed in the interlayer dielectric and the local interconnect layer 190.

The features and actions and effects of the first planar layout are described below.

(1) Each of the projecting portions 140 has a large-width region having a width greater than the width of the sub bit line SBL in the region in which the memory cells 100 are formed. Therefore, the contact portions 184 for connecting the sub bit lines SBL are easily formed in the projecting portions 140.

(2) The first and second control gates 106A and 106B have two continuous portions 160 in which the end portions of the first and second control gates 106A and 106B are connected. This enables the resistance of the control gates to be approximately halved in comparison with the case where the continuous portion is formed in only one of the end portions of the first and second control gates 106A and 106B.

(3) In the even-numbered sub bit lines SBL0 and SBL2, the projecting portions 140 are formed on one of the end portions of the sub bit line. In the odd-numbered sub bit lines SBL1 and SBL3, the projecting portions 140 are formed on the opposite end portions of the sub bit lines. This enables the degree of integration of the memory cells to be increased for the following reasons.

In the case of forming the projecting portions 140 on the end portions of the even-numbered and odd-numbered sub bit lines SBL on the same side, it is necessary to secure a certain amount of margin relating to the interval between the projecting portions 140. However, in the present embodiment, since the projecting portions 140 are formed on opposite end portions of the even-numbered and odd-numbered sub bit lines, it is unnecessary to secure a margin relating to the interval between the projecting portions 140. Therefore, the degree of integration of the memory cells can be increased.

Second Planar Layout of Small Memory Block

FIG. 15 is a view showing a planar layout of the non-volatile semiconductor memory device in bulk shown in FIGS. 10 and 11. In FIG. 15, the word lines WL formed in an upper layer of the control gates are schematically indicated by lines.

The sub bit lines SBL0–SBL3 consist of sub bit impurity layers formed in the semiconductor substrate. The first and second control gates 106A and 106B are formed on either side of each of the sub bit lines SBL0–SBL3. In this planar layout, only one of the end portions of the first and second control gates 106A and 106B formed on either side of the sub bit line SBL is connected through the continuous portion 160 differing from the first planar layout. Specifically, the first and second control gates 106A and 106B have a non-continuous portion in which the other end portions are not connected.

The continuous portions 160 are formed on one of the end portions of the first and second control gates 106A and 106B formed on either side of the even-numbered sub bit lines SBL0 and SBL2. The continuous portions 160 are formed on the opposite end portions of the first and second control gates 106A and 106B formed on either side of the odd-numbered sub bit lines SBL1 and SBL3.

Strap group regions A20 are formed between the sub bit lines SBL adjacent in the first direction (column direction) A (for example, between the sub bit line SBL1 in the small memory block 0 and the sub bit line SBL1 in the small memory block 1). In this planar layout example, the end portions of the first and second control gates 106A and 106B formed on either side of the sub bit line SBL are not connected on the side in which the strap group region A20 is formed. The first and second select transistors Q1 and Q2 are formed in the strap group region A20 in the same manner as in the first planar layout.

The strap group region A20 is described below in detail with reference to FIG. 16. FIG. 16 is an enlarged plan view of the strap group region A20 shown in FIG. 15. FIG. 17 is a cross-sectional view schematically showing the cross section along the line D—D shown in FIG. 16.

In this layout example, each of the impurity layers 132 and 134 of the switching elements Q is formed by extending the sub bit lines SBL. Specifically, the sub bit line SBL and the impurity layer of the switching element Q are directly electrically connected. Since other configurations of the strap group region A20 are the same as in the first planar layout, the detailed description is omitted.

The features and actions and effects of the second planar layout are described below.

The end portions of the first and second control gates 106A and 106B formed on either side of the sub bit line SBL are not connected on the side in which the switching element Q is formed. Therefore, when forming the sub bit lines SBL and the impurity layers of the switching elements Q, the impurity layers 132 and 134 of the switching elements Q can be formed so as to be directly electrically connected with the sub bit lines SBL. This eliminates the need for a step for electrically connecting the sub bit lines SBL with the impurity layers 132 and 134 of the switching element Q (for example, a step of forming a crossunder impurity layer in the semiconductor substrate) As a result, a mask for specifying the formation region of the crossunder impurity layer is unnecessary, for example.

Moreover, the sub bit lines SBL and the impurity layers 132 and 134 of the switching elements Q are directly connected. Therefore, the resistances of the bit lines can be decreased.

Description of Operation

Tables 1 to 3 show the potential of the sub control gate line SCG, sub bit line SBL, and word line WL to be set at the time of erasing data and programming in the non-volatile semiconductor memory device of the present embodiment.

TABLE 1

| | Selected cell | | | |
|---|---|---|---|---|
| | SCG | SBL | WL | BLS |
| Erase | −1 V to −3 V | 4.5 V to 5 V | 0 V | 8 V |
| Program | 5.5 V or 2.5 V | 5 V | 1.0 V | 8 V |

TABLE 2

| | Non-selected cell (in selected sector) | | | |
|---|---|---|---|---|
| | SCG | SBL | WL | BLS |
| Erase | — | — | — | — |
| Program | 5.5 V or 2.5 V or 0 V | 0 V | 0 V | 8 V |

TABLE 3

| | Non-selected cell (in non-selected sector) | | | |
|---|---|---|---|---|
| | SCG | SBL | WL | BLS |
| Erase | 0 V | 0 V | 0 V | 8 V |
| Program | 0 V | 0 V | 0 V or 1 V | 8 V |

In Table 1, since all the memory cells in the sector region 0 (selected sector) become the selected cells when erasing data, 0 V is supplied to 4096 word lines WL, for example. The first high potential for erasing (−1 to −3V, for example) is supplied to four main control gate lines MCG0–MCG3 by the CG driver 300, whereby the first high potential for erasing is collectively supplied to the control gates 106A and 106B in all the memory cells in the sector region 0 (selected sector). At this time, the second high potential for erasing (4.5–5 V, for example) is supplied to all the sub bit lines SBL in the sector region 0. The method of supplying the second high potential for erasing is described later. A potential (8 V, for example) is supplied to the select signal lines BLS in the selected cells. This causes the switching elements to be turned ON, whereby the sub bit lines and the main bit lines in the selected cells are connected. Data can be erased in all the memory cells in the selected sector region 0 in this manner.

As shown in Table 3, 0 V is supplied to all 4096 word lines WL in the non-selected sector region 1, for example. However, since 0 V can be supplied to the sub control gate line SCG and the sub bit lines SBL separately from the sector region 0, data is not erased in the non-selected sector.

A programming operation is described below. Programming of 16-bit data is performed at the same time in each MONOS memory cell corresponding to 16 I/Os in the selected sector region 0. In this example, 1 V is supplied to one word line WL connected with the selected cell in the sector region 0. Other 4095 word lines WL are set to 0 V. In 16 small memory blocks 216 in the sector region 0, 2.5 V is supplied to the control gate line SCG corresponding to SCG [i] shown in FIG. 5. 5.5 V is supplied to the control gate line SCG corresponding to SCG [i+1] shown in FIG. 5. Other control gate lines SCG are set to 0 V. In the memory blocks 214 corresponding to the I/O0–I/O15 in the sector region 0, 5 V is supplied to one main bit line MBL corresponding to the sub bit line SBL [i+1] shown in FIG. 5. Other main bit lines MBL are set to 0 V. The sub bit line SBL in the selected memory cell is connected with the main bit line MBL by causing the switching element to be turned ON based on the potential of the select signal line BLS.

In the non-selected cells in the selected sector region 0, the word lines WL are set to 0 V and a high potential of 5.5 V or 2.5 V, or 0 V, is applied to the control gate lines SCG, as shown in Table 2. The sub bit lines SBL in the non-selected cells in the selected sector region Q are set to 0 V, since the select signal lines BLS are set to 8 V whereby the select transistors are turned ON.

In the non-selected cells in the non-selected sector region, 0 V is applied to both the sub control gate lines SCG and the main bit lines MBL, as shown in Table 3. Therefore, disturbance caused when a high potential similar to that at the time of programming is applied does not occur in the non-selected cells in the non-selected sector region.

A high potential is applied to the control gates in the non-selected cells in the selected sector region 0. However, such a high potential is applied only in the case where the programming is performed in the sector region 0. Therefore, frequency of the application of high potential is significantly decreased in comparison with the case where the high potential is applied to the non-selected cells in other sector regions each time programming is performed in one of the sector regions, whereby occurrence of disturbance can be prevented.

Description of Comparative Example

FIG. 18 shows a configuration of a comparative example. In this comparative example, the memory cell array region is divided in the column direction and has a plurality of sector regions 0, 1, ... in which the column direction is the longitudinal direction. In the comparative example, CG drivers 400 and 401 are not formed corresponding to the sector regions 0 and 1, but are shared by the sector regions 0 and 1.

As shown in FIG. 18, a select gate region 402 and a select gate region 403 are formed corresponding to the sector region 0 and the sector region 1, respectively. N-type MOS transistors disposed in the select gate regions 402 and 403 select whether or not to supply the potential from the CG drivers 400 and 401 to the sector regions 0 and 1 based on the potential of the select signal lines CGS0 and CGS1.

In the comparative example, the potential may be set to substantially the same potential in the present embodiment shown in Tables 1 to 3. However, this can be attained by providing the select gate regions 402 and 403. If the select gate regions 402 and 403 are not provided, a high potential is also applied to the non-selected cells in the non-selected sector region 1 at the time of programming of the selected cell in the selected sector region 0. If the high potential at the time of programming is applied to the non-selected cells across the sector regions, the high potential is applied to the non-selected cells each time programming is performed, whereby disturbance occurs.

In the comparative example, it is indispensable to provide the select gate region for the control gates in each sector region in order to prevent the occurrence of disturbance.

In the comparative example, since the use of N-type MOS transistors in the select gate regions 402 and 403 causes a voltage drop to occur, a voltage for the voltage drop must be added to the necessary first high potential for erasing supplied from the CG drivers 400 and 401. This results in an increase in the voltage.

In the above-described embodiment of the present invention, the select gate region for applying a potential to the specific control gates can be omitted while preventing the occurrence of disturbance.

The present invention is not limited to the above-described embodiment. Various modifications and variations are possible without departing from the spirit and scope of the present invention.

For example, the structure of the non-volatile memory elements 108A and 108B is not limited to the MONOS structure. The present invention may be applied to a non-volatile semiconductor memory device using various types of other memory cells capable of independently trapping charges at two sites by one word gate 104 and first and second control gates 106A and 106B.

What is claimed is:

1. A non-volatile semiconductor memory device comprising:

a memory cell array region in which are disposed a plurality of memory cells in first and second directions intersecting each other, each of the memory cells having first and second non-volatile memory elements that are controlled by one word gate and first and second control gates; and a control gate drive section which drives the first and second control gates of the memory cells within the memory cell array region, wherein the memory cell array region is divided in the second direction into a plurality of sector regions;

wherein the control gate drive section has a plurality of control gate drivers each of which corresponds to one of the sector regions;

wherein each of the sector regions is divided in the first direction into a plurality of block regions, and each of the block regions has a plurality of memory cells;

wherein each of the block regions has a plurality of sub bit lines respectively connected to the memory cells and extending in the first direction;

wherein a plurality of main bit lines are provided over the plurality of block regions extending in the first direction, and each of the main bit lines is commonly connected to the sub bit lines within the block regions;

wherein a plurality of switching elements which select connection/disconnection are provided at connections between the main bit lines and the sub bit lines;

wherein the first control gate and the second control gate, which are connected with two memory cells adjacent in the second direction, are formed on either side of each of the sub bit lines;

wherein the first and second control gates formed on either side of each of the sub bit lines have two continuous portions in which end portions of the first and second control gates are connected;

wherein each of the sub bit lines has a projecting portion in which one of the end portions project in the first direction outside end portion of an adjacent sub bit line among the sub bit lines arranged in the second direction; and wherein the projecting portion has a large-width region having a width greater than the width of each of the sub bit lines in a region in which the memory cells are formed.

2. The non-volatile semiconductor memory device according to claim 1,
wherein each of the switching elements is provided at a position facing the projecting portion of each of the sub bit lines.

3. The non-volatile semiconductor memory device according to claim 2,
wherein in each of the block regions, an odd-numbered switching element is connected to an end portion of an odd-numbered sub bit line on one side, and an even-numbered switching element is connected to an end portion of an even-numbered sub bit line on the opposite side, among the plurality of the sub bit lines.

4. The non-volatile semiconductor memory device according to claim 2,
wherein in two of the block regions adjacent to each other in the first direction, when the switching elements in one block region are referred to as first switching elements and the switching elements in the other block region are referred to as second switching elements, the first and second switching elements commonly connected to one of the main bit lines are disposed to be adjacent to each other.

5. The non-volatile semiconductor memory device according to claim 1,
wherein each of the control gate drivers is capable of setting a potential for the first and second control gates within the corresponding sector region independently of other sector regions.

6. A non-volatile semiconductor memory device comprising:
a memory cell array region in which are disposed a plurality of memory cells in first and second directions intersecting each other, each of the memory cells having first and second non-volatile memory elements that are controlled by one word gate and first and second control gates; and
a control gate drive section which drives the first and second control gates of the memory cells within the memory cell array region,
wherein the memory cell array region is divided in the second direction into a plurality of sector regions;
wherein the control gate drive section has a plurality of control gate drivers each of which corresponds to one of the sector regions;
wherein each of the sector regions is divided in the first direction into a plurality of block regions, and each of the block regions has a plurality of memory cells;
wherein each of the block regions has a plurality of sub bit lines respectively connected to the memory cells and extending in the first direction;
wherein a plurality of main bit lines are provided over the plurality of block regions extending in the first direction, and each of the main bit lines is commonly connected to the sub bit lines within the block regions;
wherein a plurality of switching elements which select connection/disconnection are provided at connections between the main bit lines and the sub bit lines;
wherein the sub bit lines are formed of sub bit impurity layers; and
wherein source/drain impurity layers which become one of a source and drain of the switching elements are formed by extending the sub bit impurity layers.

7. The non-volatile semiconductor memory device according to claim 6,
wherein each of the switching elements is formed at a position facing end portion of each of the sub bit lines; and
wherein the first control gate and the second control gate, which are connected with two memory cells adjacent in the second direction, are formed on either side of each of the sub bit lines.

8. The non-volatile semiconductor memory device according to claim 7,
wherein the first and second control gates formed on either side of the sub bit lines have a non-continuous portion in which end portions on the side on which the switching elements are formed are not connected.

9. The non-volatile semiconductor memory device according to claim 7,
wherein the first and second control gates formed on either side of the sub bit lines have a continuous portion in which end portions opposite to the side on which the switching elements are formed are connected.

10. The non-volatile semiconductor memory device according to claim 7,
wherein in each of the block regions, an odd-numbered switching element is connected to an end portion of an odd-numbered sub bit line on one side, and an even-numbered switching element is connected to an end portion of an even-numbered sub bit line on the opposite side, among the plurality of the sub bit lines.

11. The non-volatile semiconductor memory device according to claim 10,
wherein in two of the block regions adjacent to each other in the first direction, when the switching elements in one block region are referred to as first switching elements and the switching elements in the other block region are referred to as second switching elements, the first and second switching elements commonly connected to one of the main bit lines are disposed to be adjacent to each other.

12. The non-volatile semiconductor memory device according to claim 6,
wherein each of the control gate drivers is capable of setting a potential for the first and second control gates within the corresponding sector region independently of other sector regions.

* * * * *